(12) United States Patent
Tseng

(10) Patent No.: US 7,108,518 B2
(45) Date of Patent: Sep. 19, 2006

(54) ASSEMBLY STRUCTURE OF AN ELECTRICAL CARD

(75) Inventor: Tien-Chih Tseng, Taipei (TW)

(73) Assignee: Longwell company, Taipei (TW)

( * ) Notice: Subject to any disclaimer, the term of this patent is extended or adjusted under 35 U.S.C. 154(b) by 0 days.

(21) Appl. No.: 11/249,259

(22) Filed: Oct. 14, 2005

(65) Prior Publication Data

US 2006/0166527 A1    Jul. 27, 2006

(30) Foreign Application Priority Data

Jan. 21, 2005   (TW) ............................... 94201195 U

(51) Int. Cl.
*H01R 12/00*    (2006.01)
*H01R 13/648*   (2006.01)

(52) U.S. Cl. ..................... 439/76.1; 439/946

(58) Field of Classification Search ............... 439/76.1, 439/945, 946; 361/737

See application file for complete search history.

(56) References Cited

U.S. PATENT DOCUMENTS 5,339,222 A * 8/1994 Simmons et al. ........... 361/818
5,548,483 A * 8/1996 Feldman ..................... 361/737
5,780,365 A * 7/1998 Nogami ..................... 439/76.1
5,896,274 A * 4/1999 Ishida ........................ 361/737
6,183,307 B1 * 2/2001 Laity et al. ................. 439/676

* cited by examiner

*Primary Examiner*—Tho D. Ta
(74) *Attorney, Agent, or Firm*—Birch, Stewart, Kolasch & Birch, LLP

(57) ABSTRACT

The present invention discloses an assembly structure of an electrical card, wherein the conventional plastic frame and connector are integrated into a connector frame; the connector frame is engaged with upper and lower shells via press-fitting front press-fit platelets of the upper shell and press-fit hooks of the lower shell; a back cover has two extension arms protruding from its two lateral sides, and the other ends of the upper and lower shells are press-fit to the back cover and wrap those two extension arms; and the upper shell and the lower shell are wrapped by each other and press-fit together. Thereby, the upper and lower shells, the connector frame and the back cover are assembled into an electrical card structure. The present invention has a rigid joint mechanism to assemble an electrical card having superior engagement and can be easily disassembled for fixing the circuit inside the electrical card.

21 Claims, 32 Drawing Sheets

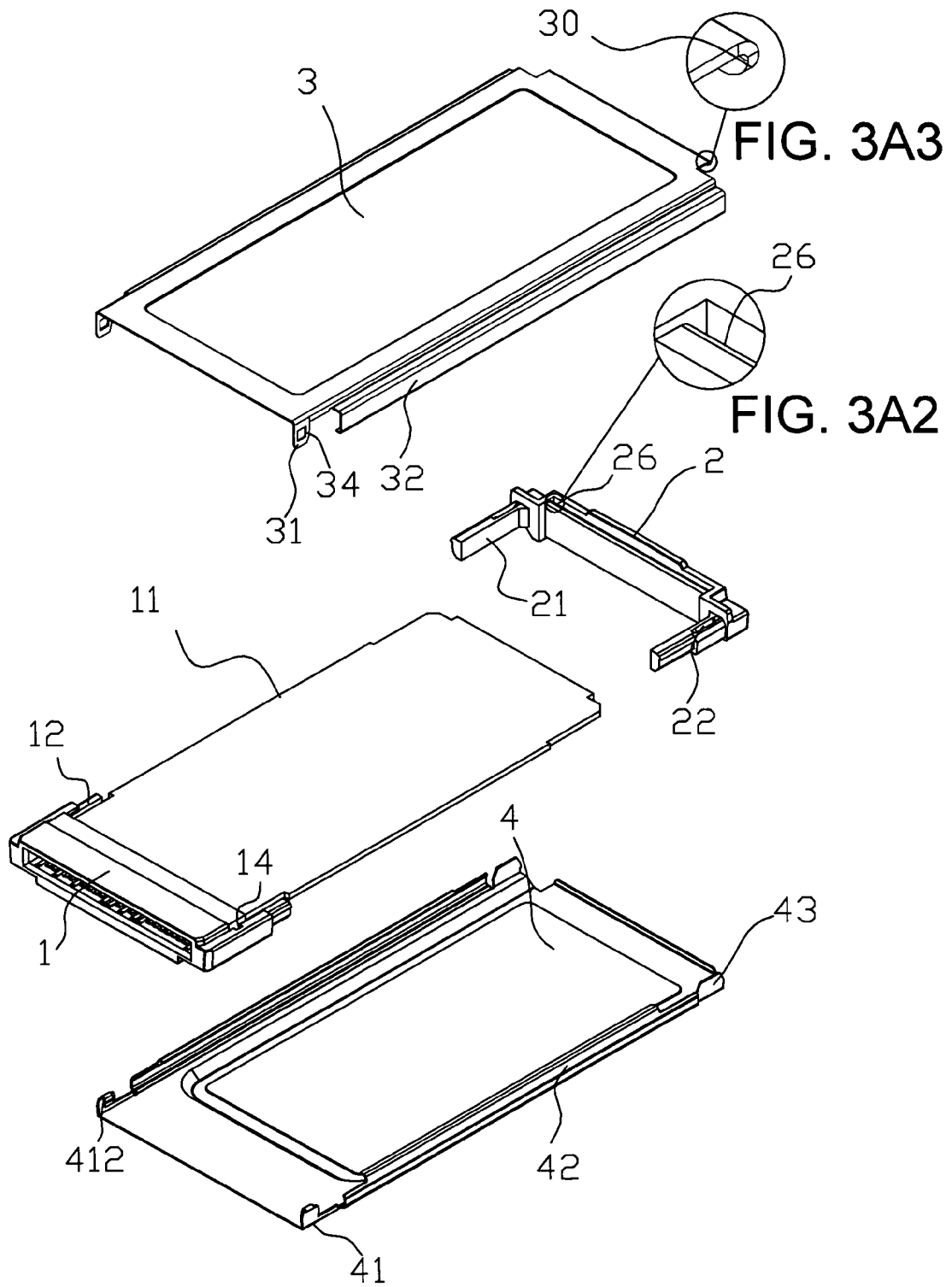
FIG. 3A1

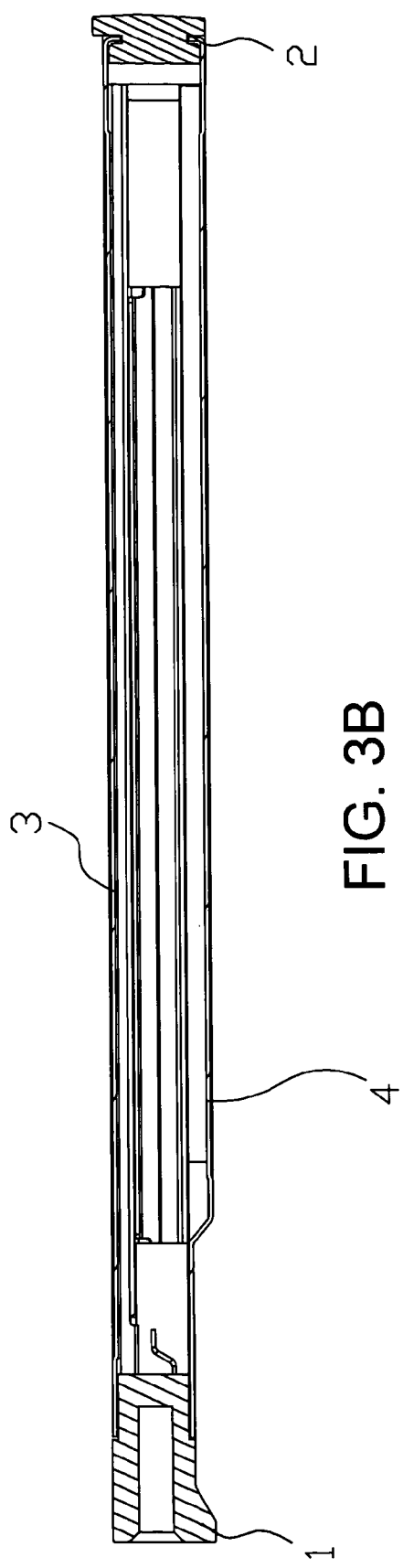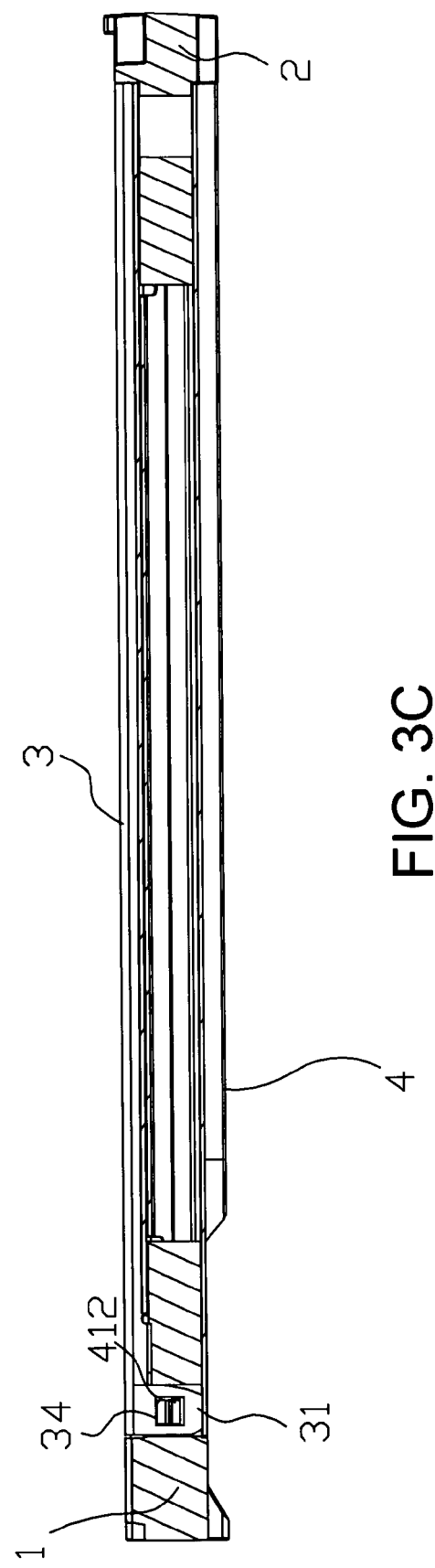

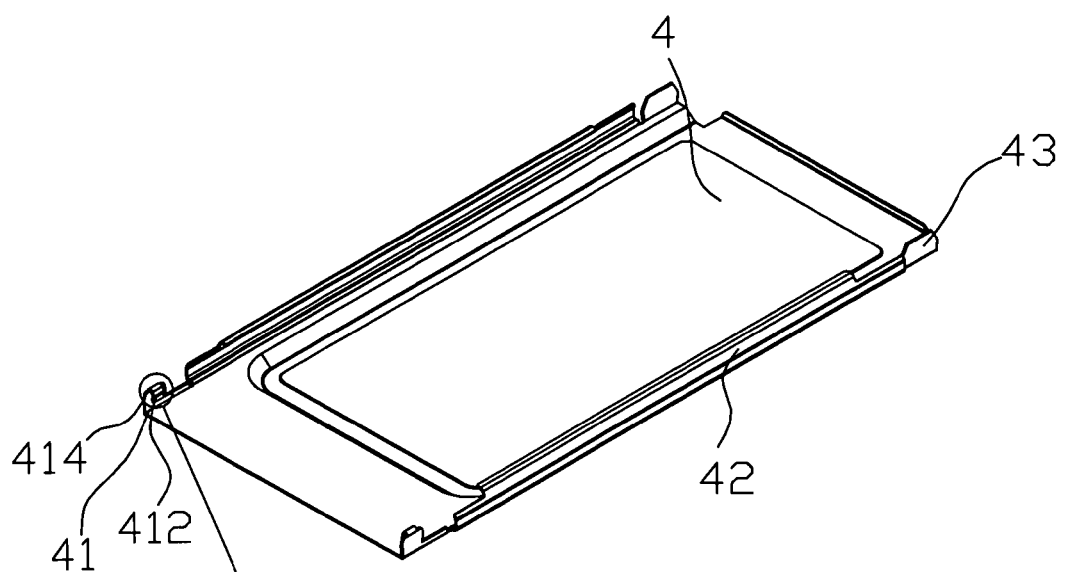
FIG. 3D1
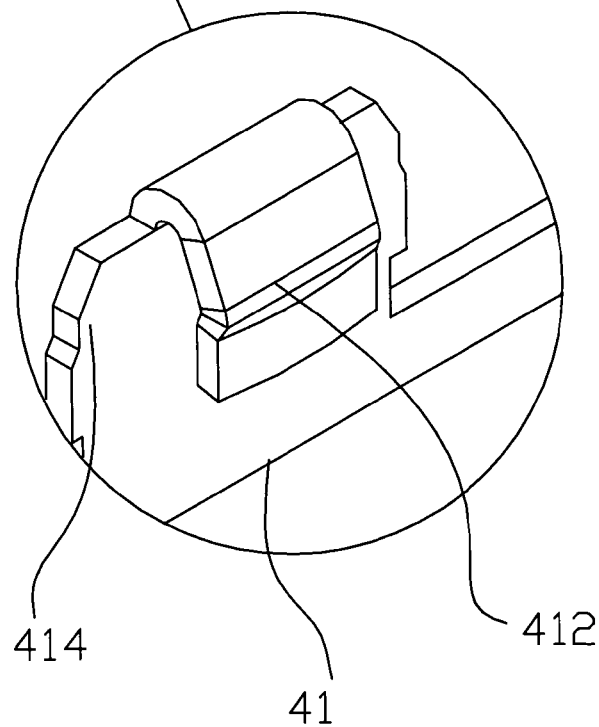
FIG. 3D2

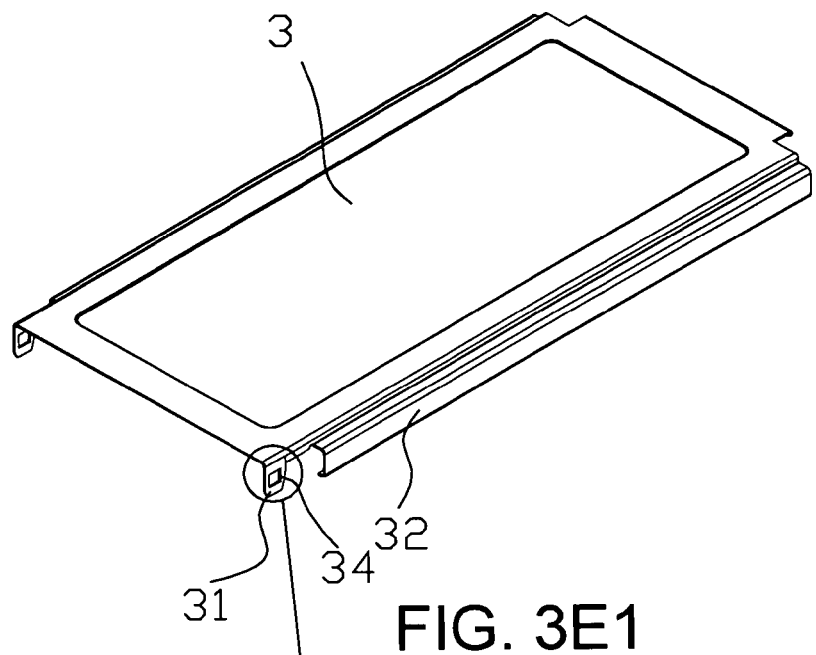
FIG. 3E1
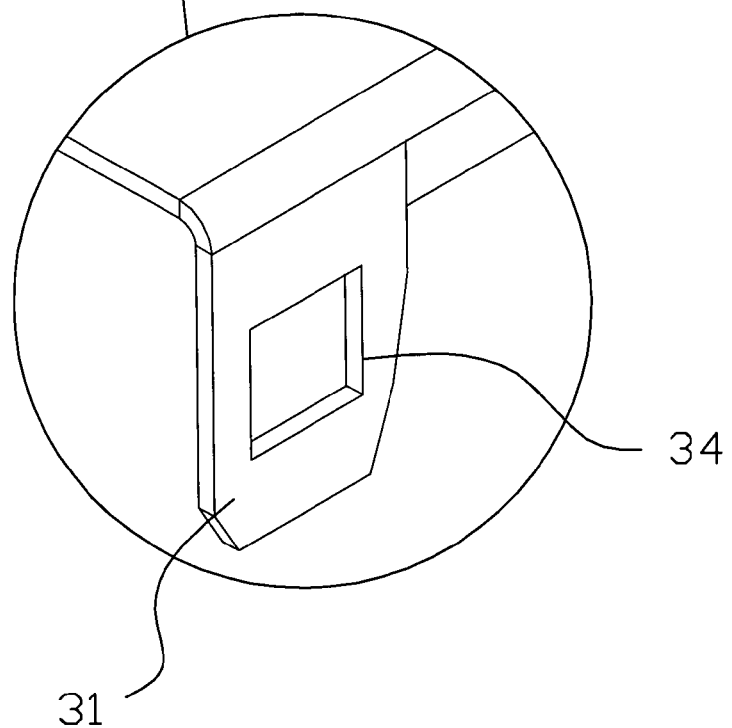
FIG. 3E2

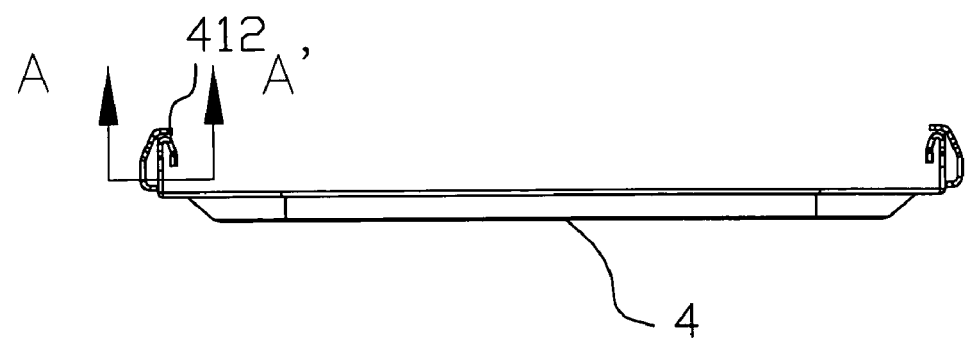
FIG. 3F1
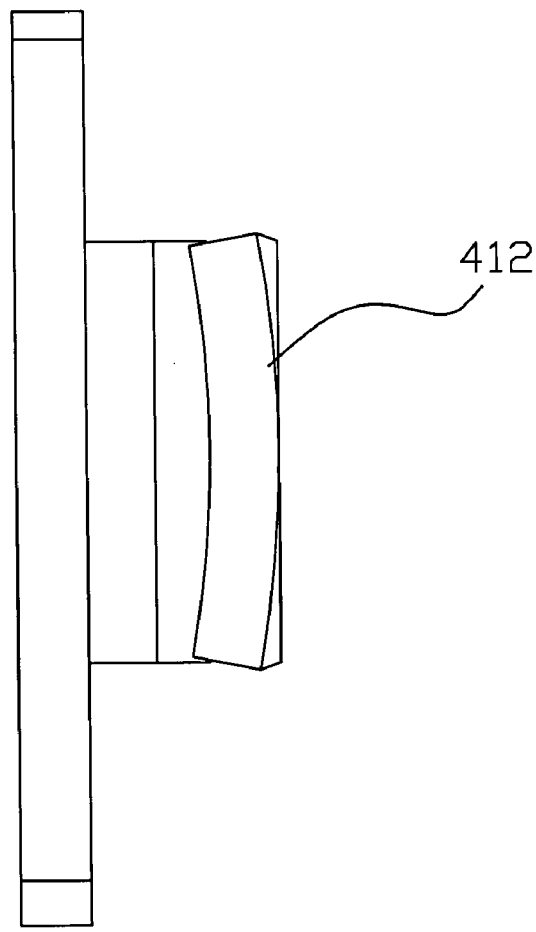
DETAIL A-A'
FIG. 3F2

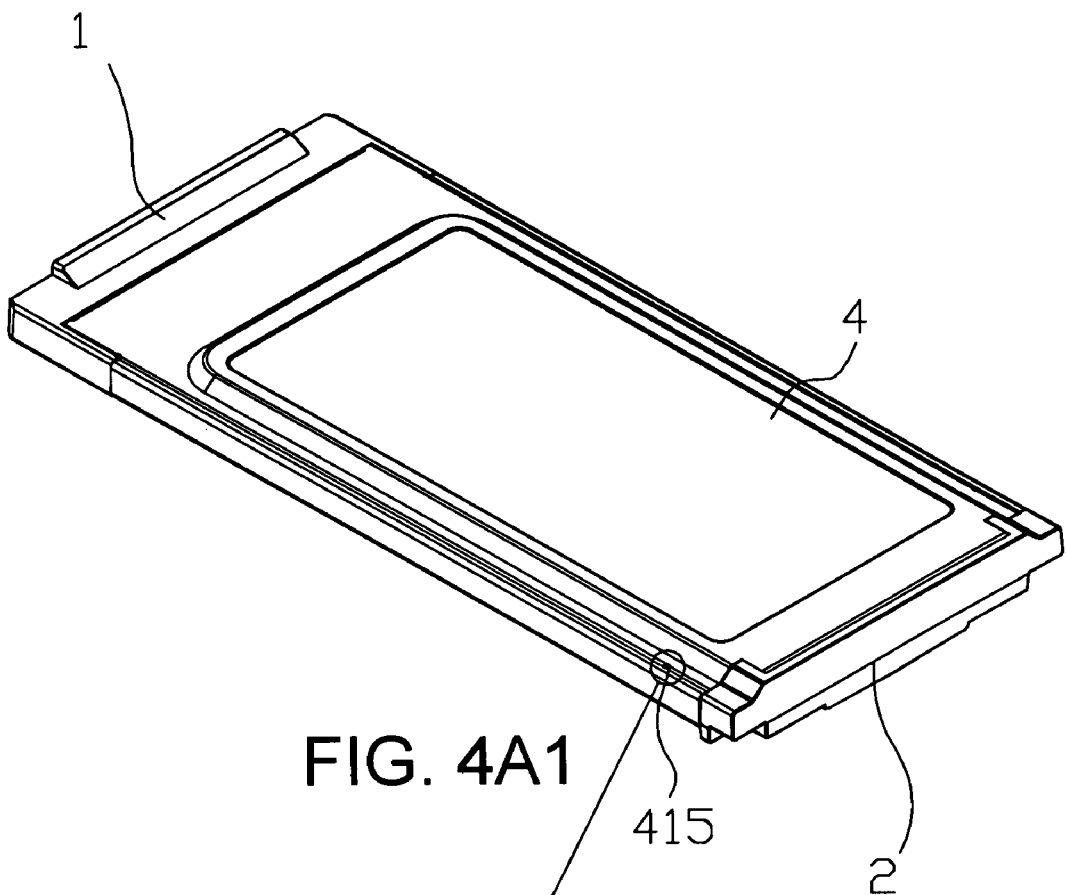
FIG. 4A1
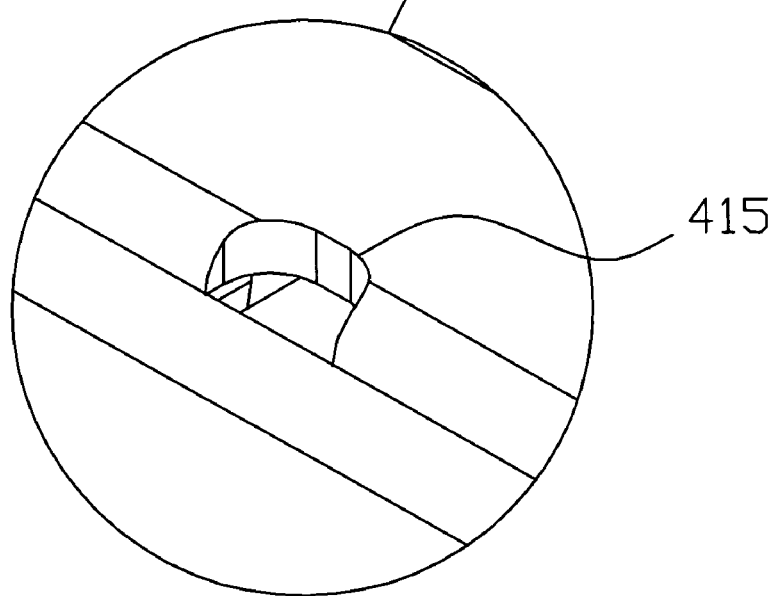
FIG. 4A2

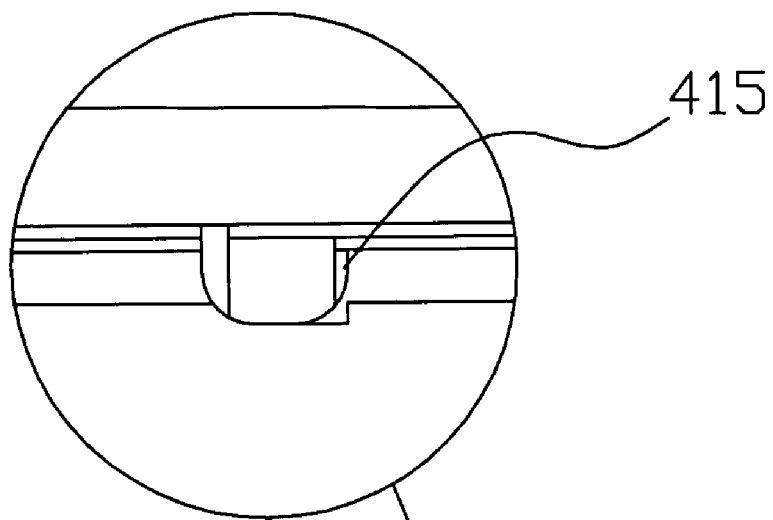
FIG. 7A2
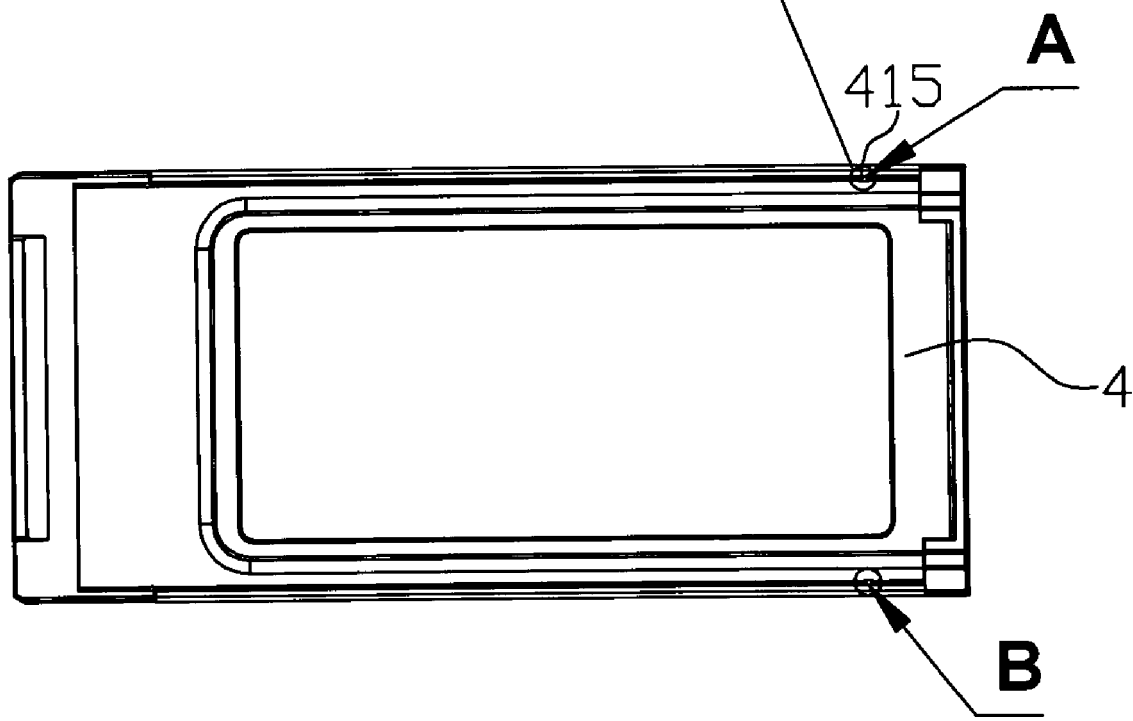
FIG. 7A1

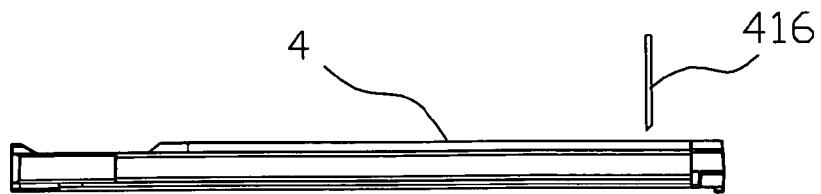
FIG. 7B1
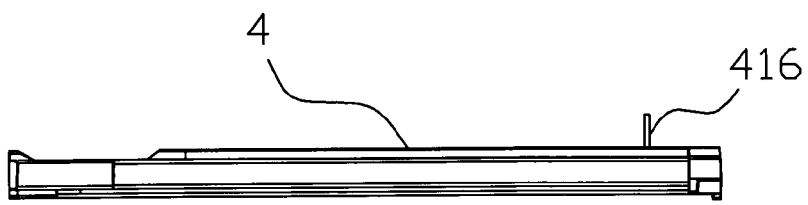
FIG. 7B2
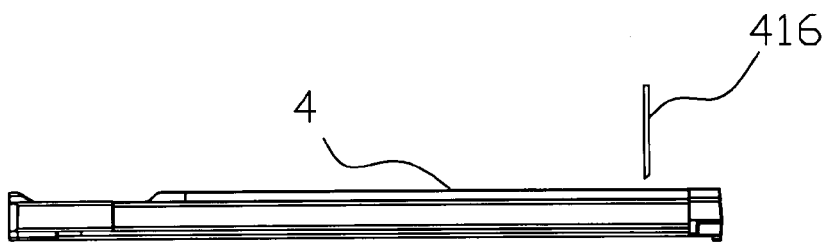
FIG. 7C1
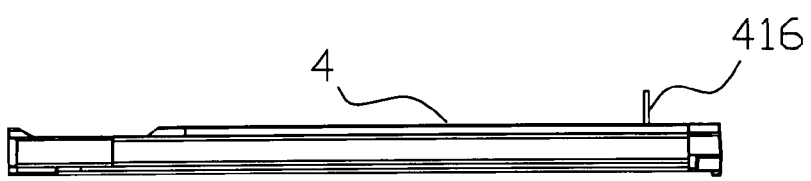
FIG. 7C2
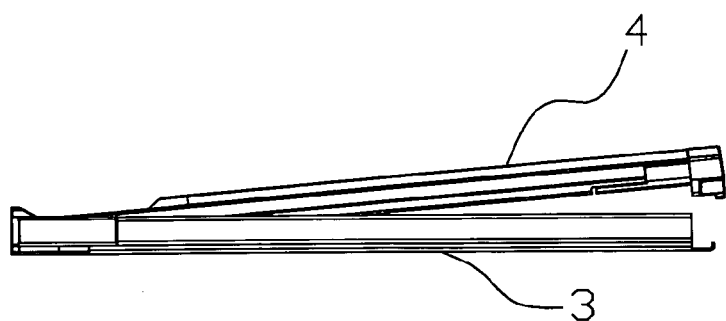
FIG. 7D

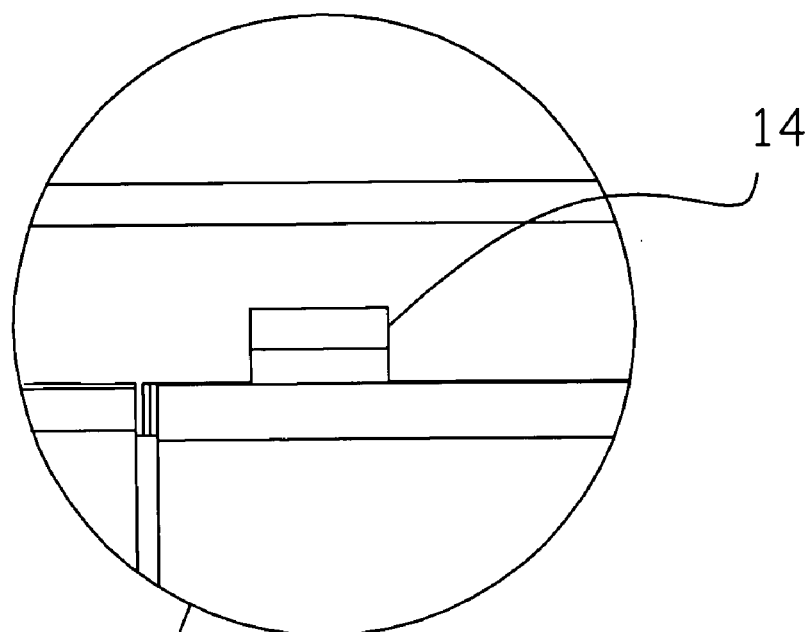
FIG. 7E2
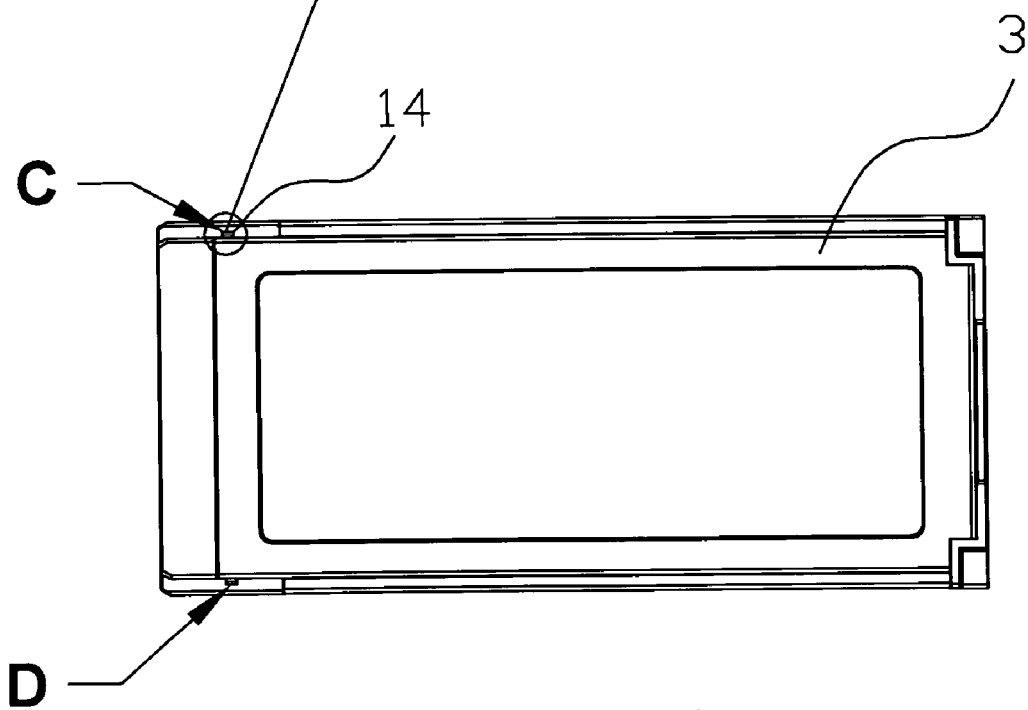
FIG. 7E1

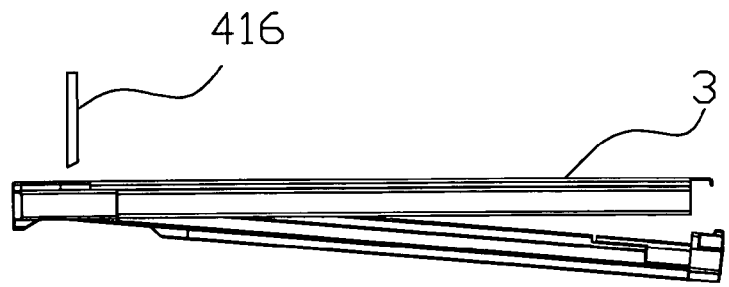
FIG. 7F1
FIG. 7F2
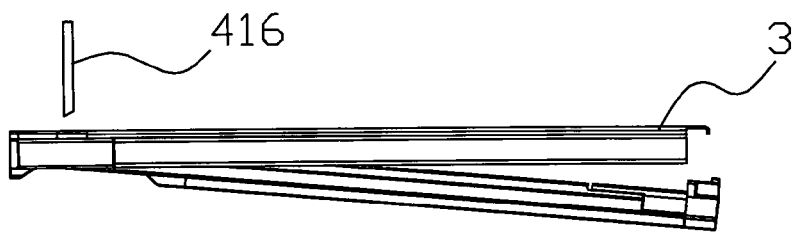
FIG. 7G1
FIG. 7G2
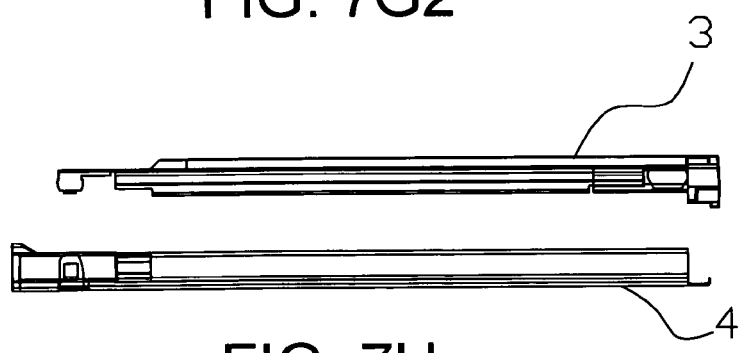
FIG. 7H

ASSEMBLY STRUCTURE OF AN ELECTRICAL CARD

BACKGROUND OF THE INVENTION

1. Field of the Invention

The present invention relates to an improved structure of an electrical card, particularly to an assembly structure applicable to a long electrical card and a short electrical card.

2. Description of the Related Art

With rapid advance of electronic technology and extensive popularity of computers, information products have been indispensable for most people, and the portable electronic products thereof, such as notebook computers and personal digital assistants, are tending to be miniaturized; thus, various electrical cards are created to expand the functions in limited dimension. The electrical cards are classified into short type and long type according to their sizes.

No matter whether it is a long card or a short card, a general electrical card has a plastic frame, and a metallic upper shell and a metallic lower shell are installed above the plastic frame. A connector soldered to the front end of a circuit board is installed to the front end of the plastic frame, and the circuit board is disposed between the metallic upper shell and the metallic lower shell. Multiple insertion platelets are formed on two lateral sides of both the shells. In one shell, each insertion platelet has a connection hole, and in the other shell, each insertion platelet is tilted outward as a press-fit platelet. Two metallic shells are assembled into a unitary body via press-fitting the press-fit platelets into the connection holes, and a back cover is assembled to the rear side of those two metallic shells.

However, there are problems in the abovementioned design of the connection hole and the press-fit platelet. If the press-fit is too tight, it is hard to disassemble for inspection and maintenance. If the press-fit is loose, the engagement is weak, and the electrical card may be split from the connection place owing to an external force, which may bring about the damage of the electrical card. Besides, in the conventional technologies of the electrical card, the plastic frame and the connector are independent elements, which need assembling together; thus, the assembly steps thereof are increased and the fabrication time thereof is also prolonged.

Accordingly, the present invention proposes an assembly structure of an electrical card having characteristics of rigid engagement and easy assembly/disassembly to overcome the abovementioned problems.

SUMMARY OF THE INVENTION

The primary objective of the present invention is to provide an assembly structure of an electrical card, wherein the plastic frame is omitted; a rigid joint mechanism is used to assemble an electrical card having superior engagement; and the electrical card structure can be easily disassembled to fix the circuit thereinside.

Another objective of the present invention is to provide an assembly structure of an electrical card, which has the characteristics of rapid and easy assembly and convenient disassembly, and can be assembled and disassembled by the user himself.

Further objective of the present invention is to provide an assembly structure of an electrical card, which has a press-fit structure for the upper and lower shells lest the assembled electrical card be easily split.

To achieve the abovementioned objectives, the present invention proposes an assembly structure of an electrical card. The assembly structure of an electrical card according to one embodiment of the present invention comprises: a connector frame, having multiple contact terminals at its rear side with the tail ends of the contact terminals electrically connected with electric contacts at the front end of a circuit board, wherein two clamp arms separately protrude from two lateral sides of the connector frame; a back cover, having two extension arms separately extending from two lateral sides thereof; and a shell, further comprising an upper shell and a lower shell, which can be press-fit together to form a unitary body that encapsulates the circuit board, wherein front press-fit platelets and press-fit hooks are separately formed on two lateral sides in one end of the upper shell and in one end of the lower shell; the press-fit hooks of the lower shell are inserted between the connector frame and the clamp arms thereof, and press-fit with the front press-fit platelets of the upper shell; the other ends of the upper shell and the lower shell are press-fit to the back cover and wrap the extension arms to assemble the shell, the connector frame and the back cover into an electrical card structure.

The assembly structure of an electrical card according to another embodiment of the present invention comprises: a connector frame, having multiple contact terminals at its rear side with the tail ends of the contact terminals electrically connected with electric contacts at the front end of a circuit board, wherein two clamp arms separately protrude from two lateral sides of the connector frame, and an N-shape connection arm extends from one of the clamp arms; a back cover, having two extension arms separately extending from two lateral sides thereof; and a shell, further comprising an L-shape upper shell and an L-shape lower shell, which can be press-fit together to form a unitary body that encapsulates the circuit board, wherein front press-fit platelets and press-fit hooks are separately formed on two lateral sides in one end of the L-shape upper shell and in one end of the L-shape lower shell; the press-fit hooks of the L-shape lower shell are inserted between the connector frame and the clamp arms thereof, and press-fit with the front press-fit platelets of the L-shape upper shell to install both the L-shape upper shell and the L-shape lower shell to two clamp arms and the N-shape connection arm; the other ends of the L-shape upper shell and the L-shape lower shell are press-fit to the back cover and wrap the extension arms to assemble the shell, the connector and the back cover into an electrical card structure.

In the abovementioned two embodiments, each front press-fit platelet of the upper shell or the L-shape upper shell has a through-hole, and each press-fit hook of the lower shell or the L-shape lower shell has an inward bent platelet, which is to be press-fit into the through-hole, and thereby, the front press-fit platelet of the upper shell or the L-shape upper shell is engaged with the press-fit hook of the lower shell or the L-shape lower shell. The abovementioned two embodiments can be applied to both the short electrical card structure and the long electrical card structure.

To enable the objectives, technical contents, characteristics and accomplishments of the present invention to be more easily understood, the embodiments of the present invention are to be described below in detail in cooperation with the attached drawings

BRIEF DESCRIPTION OF THE DRAWINGS

FIG. 3A1 is an exploded view of the assembly structure of Type I short electrical card according to the present invention.

FIG. 3A2 is a partially enlarged view of FIG. 3A1.

FIG. 3A3 is another partially enlarged view of FIG. 3A1.

FIG. 3B is a section view of the assembly structure of Type I short electrical card according to the present invention.

FIG. 3C is another section view of the assembly structure of Type I short electrical card according to the present invention.

FIG. 3D1 is a schematic diagram of the press-fit hook of the lower shell of the assembly structure of Type I short electrical card according to the present invention.

FIG. 3D2 is a partially enlarged view of FIG. 3D1.

FIG. 3E1 is a schematic diagram of the front press-fit platelet of the upper shell of the assembly structure of Type I short electrical card according to the present invention.

FIG. 3E2 is a partially enlarged view of FIG. 3E1.

FIG. 3F1 is a section view of the press-fit hook of the lower shell of the assembly structure of Type I short electrical card according to the present invention.

FIG. 3F2 is a section view along line A–A' in FIG. 3F1.

FIG. 4A1 is a bottom view of FIG. 1.

FIG. 4A2 is a partially enlarged view of FIG. 4A1.

FIG. 7A1 to FIG. 7H are another schematic diagrams showing the assembly steps of the assembly structure of Type I short electrical card according to the present invention.

FIG. 7A2 is a partially enlarged view of FIG. 7A1.

FIG. 7E2 is a partially enlarged view of FIG. 7E1.

DETAILED DESCRIPTION OF THE INVENTION

The assembly structure of an electrical card of the present invention has multiple embodiments, which are classified into Type I and Type II. Each type has sub-types of short electrical card and long electrical card.

Figure 1:
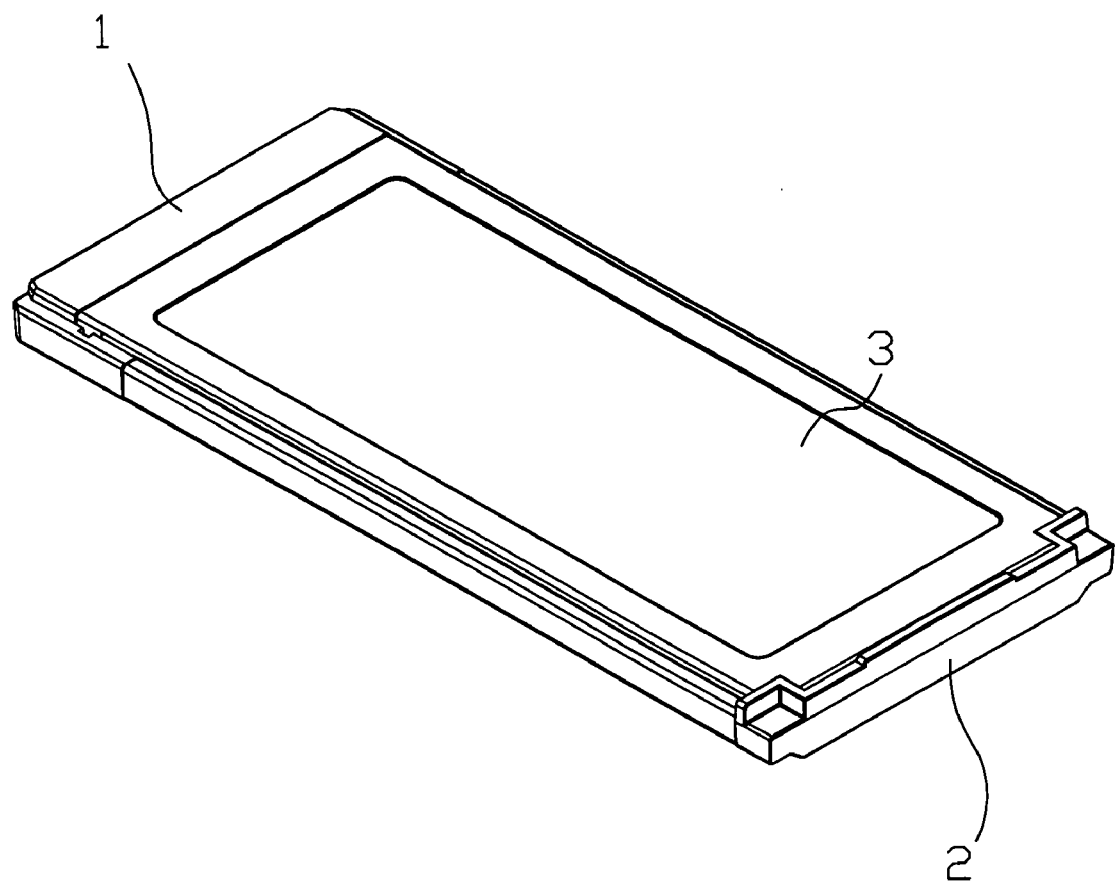
FIG. 1 is a perspective view schematically showing the assembly structure of Type I short electrical card according to the present invention.
Figure 2:
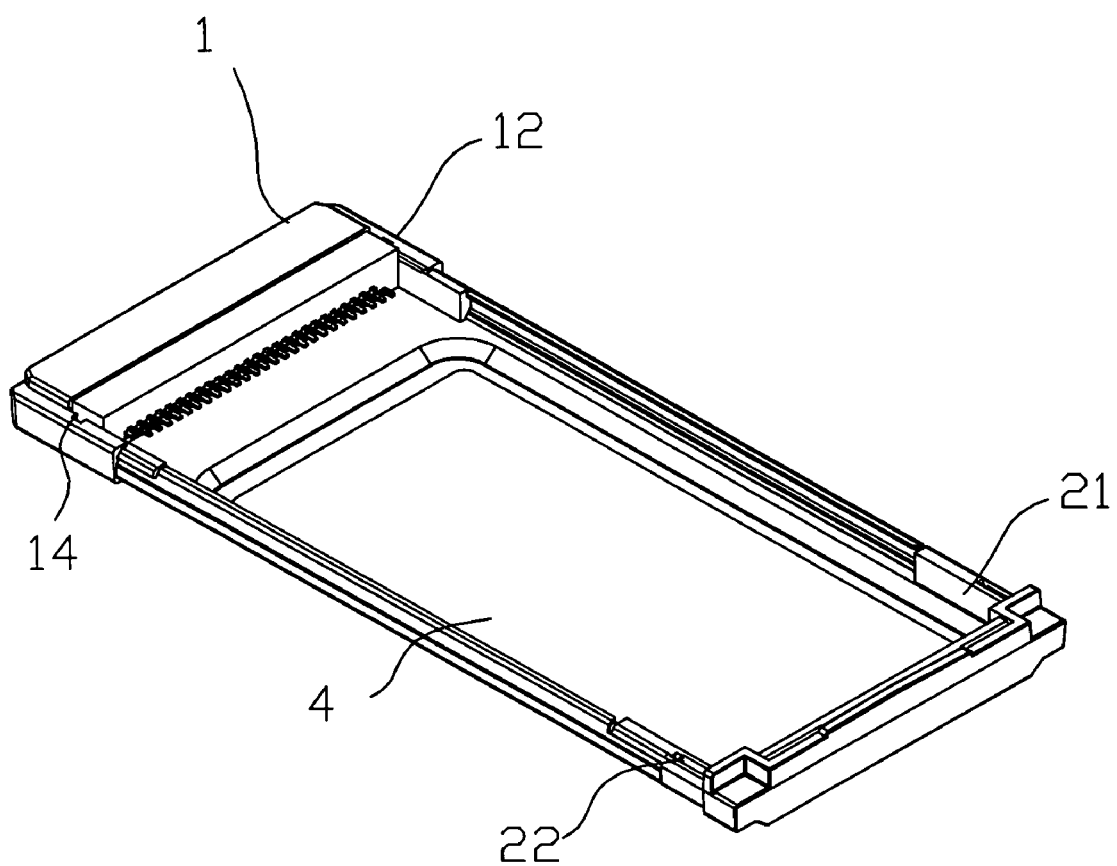
FIG. 2 is a schematic diagram of the internal structure of the assembly structure of Type I short electrical card according to the present invention.

Type I short electrical card assembly structure is to be described herein in detail firstly. Refer to FIG. 1, FIG. 2, FIG. 3A1, FIG. 3A2, and FIG. 3A3 respectively a schematic perspective view, a schematic diagram of the internal structure, exploded views and partially enlarged views of the assembly structure of Type I short electrical card according to the present invention. The assembly structure of Type I short electrical card according to the present invention comprises: a connector frame 1, used to join a connector and a frame together, wherein the connector frame 1 has multiple contact terminals in the rear side thereof (not shown in the drawing), and the tails of the contact terminals are electrically connected with electrical contacts in the front end of a circuit board 11, and two clamp arms 12 symmetrically protrude from two lateral sides of the connector frame 1, and two disposition press-fit slots 14 are respectively formed between two clamp arms 12 and the connector frame 1; a back cover 2, wherein two extension arms 21 separately protrude from two lateral sides of the back cover 2, and two press-fit slots 22 are separately formed on the top and bottom faces of each lateral side of the back cover 2, and a trench 26 is also formed in the back cover 2; a upper shell 3 and a lower shell 4, which are usually made of a metallic material and can be press-fit together to encapsulate the abovementioned circuit board 11, wherein the rear end of the upper shell 3 has a bent platelet 30, and two front press-fit platelets 31 and two first bent portions 32 are symmetrically formed on two lateral sides of the upper shell 3, and wherein two press-fit hooks 41 and two second bent portions 42 are formed in the corresponding positions on two lateral sides of the lower shell 4, and two rear press-fit platelets 43 are also formed on two lateral sides of the lower shell 4. Refer to FIG. 3B and FIG. 3C section views of the assembly structure of Type I short electrical card in different positions. Also refer to FIG. 3D1, FIG. 3D2, FIG. 3E1, and FIG. 3E2. The front press-fit platelets 31 and the press-fit hooks 41 separately on the front lateral sides of the upper and lower shells 3,4 can be inserted into the disposition press-fit slots 14 of the connector frame 1. The front press-fit platelet 31 of the upper shell 3 has a through-hole 34, and the press-fit hook 41 of the lower shell 4 has an inward bent platelet 412. Refer to FIG. 3F1 and FIG. 3F2 for the enlarged view and the section view along line A–A' of the bent platelet 412. There is a connection portion 414 between the bent platelet 412 and the lower shell 4. The connection portion 414 supports the bent platelet 412 and enables the bent platelet 412 to be slightly distorted when a force acts on it. When the bent platelet 412 is press-fit into the through-hole 34 of the front press-fit platelet 31 of the upper shell 3, the press-fit strength and the contact area between the front press-fit platelet 31 of the upper shell 3 and the press-fit hook 41 of the lower shell 4 is increased because of the slight distortion of the bent platelet 412 so that they can be engaged securely. The rear press-fit platelets 43 on two lateral sides of the lower shell 4 are inserted into the press-fit slots 22 of the back cover 2. When one end of the upper shell 3 and one end of the lower shell 4 are installed to the connector frame 1 and two clamp arms 12 thereof, and the other ends of the upper and lower shells 3,4 are installed to the back cover 2 and the extension arms 21 thereof, the first bent portions 32 of the upper shell 3 wrap the second bent portions 42 of the lower shell securely and are press-fit with the second bent portions 42 of the lower shell 4; thereby, a Type I short electrical card structure is assembled well.

As shown in FIG. 4A1 and FIG. 4A2, the seams of the assembled upper and lower shells 3, 4 will appear on the bottom surface of Type I short electrical card, which can improve the appearance of the electrical card. Further, the bottom surface of Type I short electrical card has a hole 415 for disassembly.

In assembly, firstly, the press-fit hooks 41 and the rear press-fit platelets 43 of the lower shell 4 are separately inserted into the disposition press-fit slots 14 of the connector frame 1 and the press-fit slots 22 of the back cover 2, and the press-fit hooks 41 will tightly press against the inner surfaces of the disposition press-fit slots 14, which temporarily holds the lower shell 4, and the lower shell 4 will also tightly press against the clamp arms 12 and the extension arms 21 for supporting the lower shell 4 itself; thus, the lower shell 4, the connector frame 1 and the back cover 2 can be held together. Next, the front press-fit platelets 31 of the upper shell 3 are inserted into the disposition press-fit slots 14 of the connector frame 1 to enable the front press-fit platelets 31 itself to be securely press-fit together with the press-fit hooks 41 of the lower shell 4, and the upper shell 3 also tightly presses against the clamp arms 12 and the extension arms 21, and the first bent portions 32 of the upper shell 3 wrap the second bent portions 42 of the lower shell 4 and are press-fit with the second bent portions 42 of the lower shell 4. Thereby, the upper and lower shells 3, 4, the connector frame 1 and the back cover 2 are assembled into a Type I short electrical card structure.

Figure 5A:
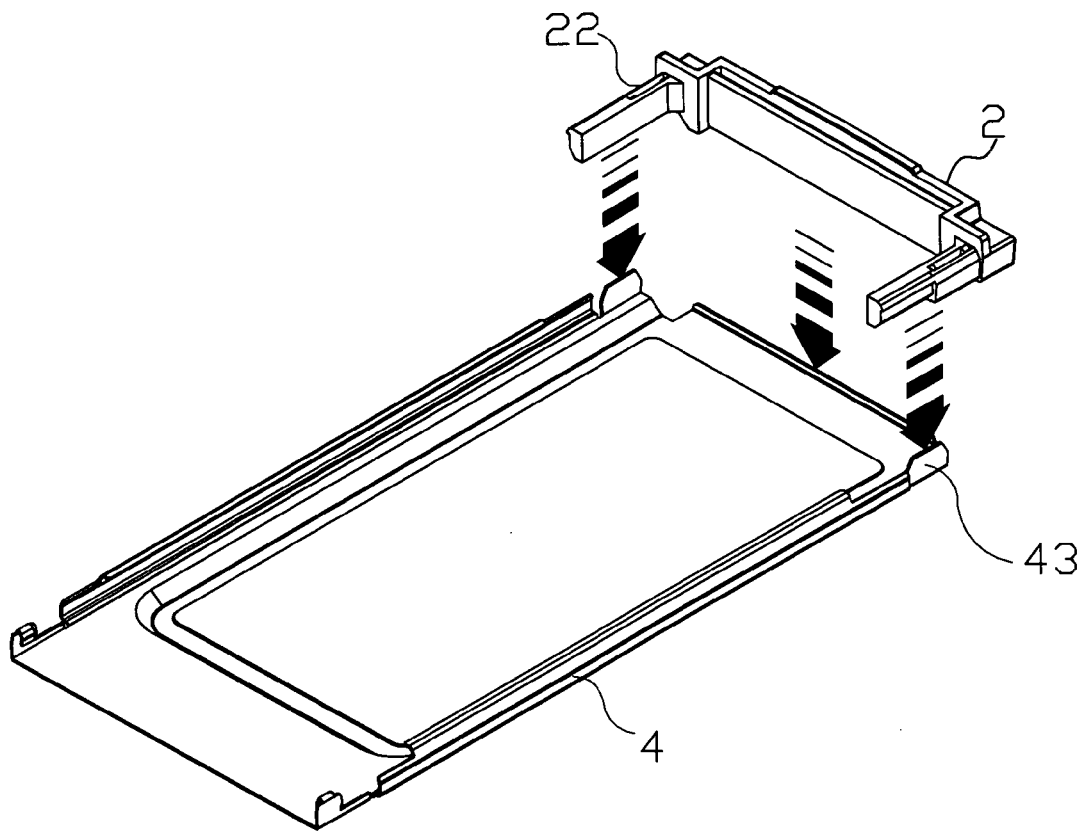
FIG. 5A to FIG. 5F are schematic diagrams showing the assembly steps of the assembly structure of Type I short electrical card according to the present invention.
Figure 5B:
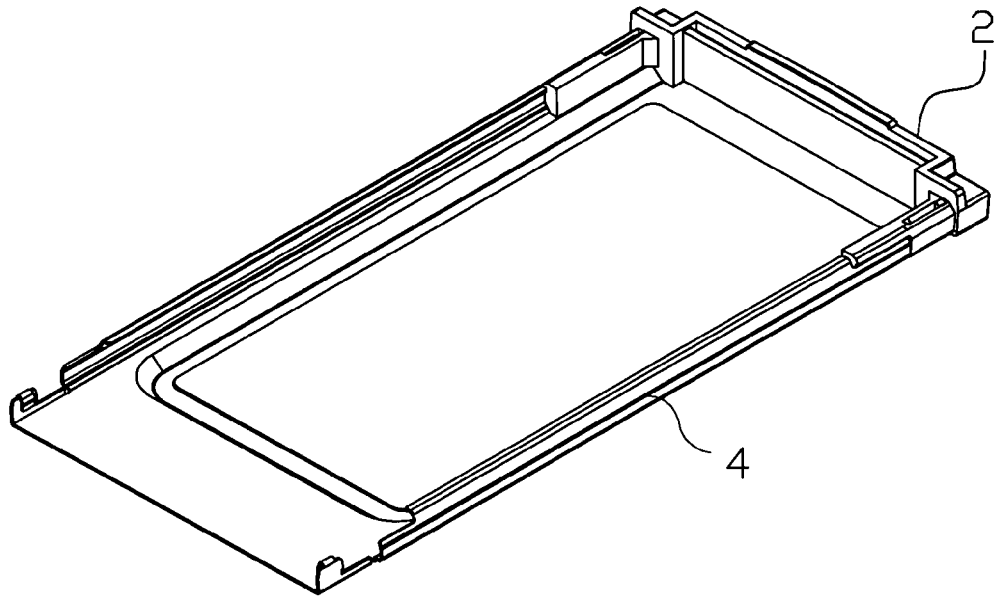
Figure 5C:
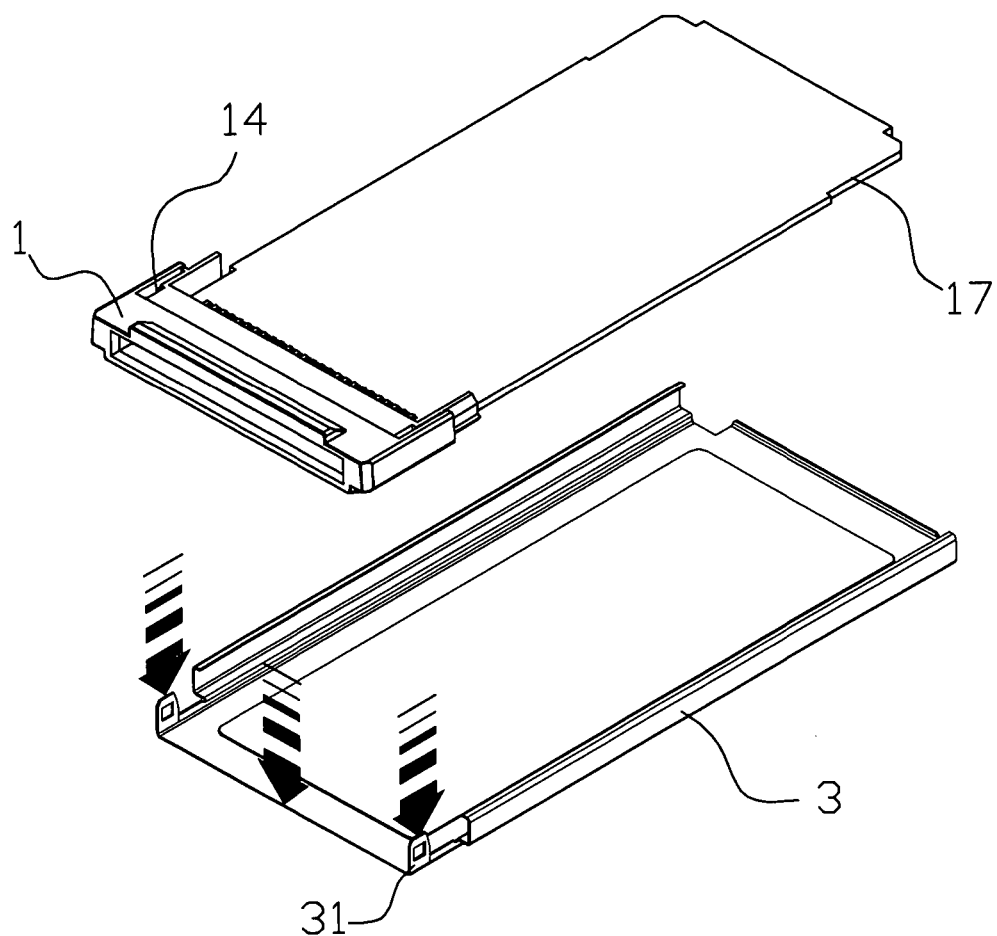
Figure 5D:
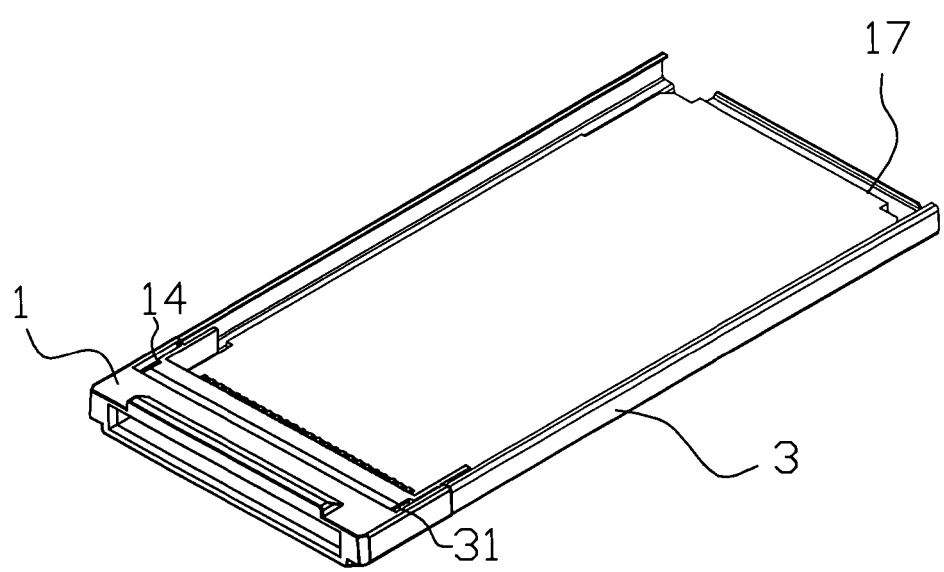
Figure 5E:
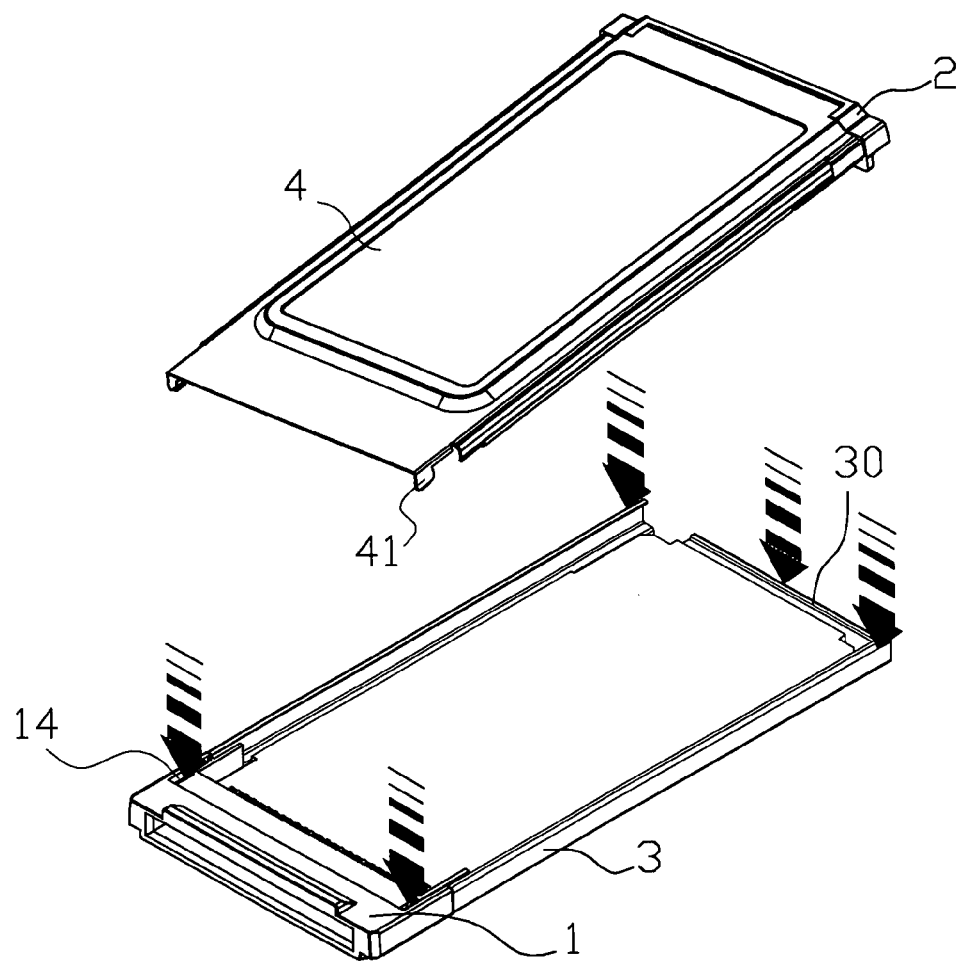
Figure 5F:
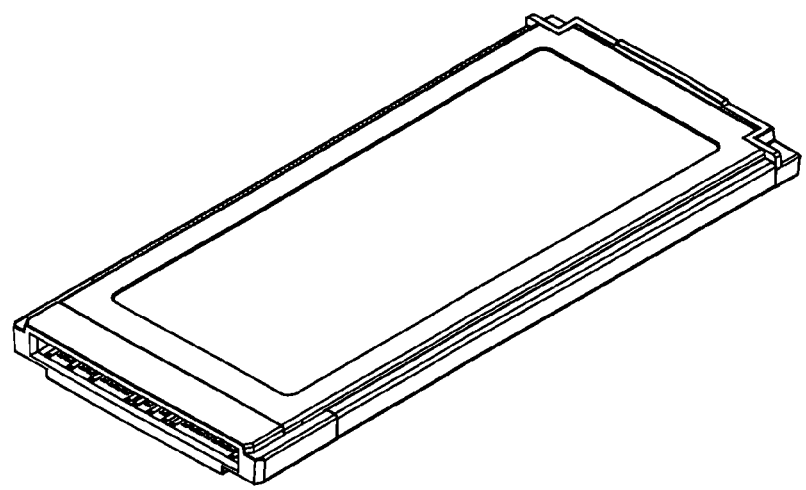

Type I short electrical card is assembled as follows. Firstly, the rear press-fit platelets 43 of the lower shell 4 are aimed at the press-fit slots 22 of the back cover 2, as shown in FIG. 5A, and then, the rear press-fit platelets 43 of the lower shell 4 are inserted into the press-fit slots 22 of the back cover 2, and then, they are slightly pressed to assemble the back cover 2 and the lower shell 4 together, as shown in FIG. 5B. Next, two disposition press-fit slots 14 on two lateral sides of the connector frame 1, which is connected with a circuit board 17, are aimed at the front press-fit platelet 31 of the upper shell 3, as shown in FIG. 5C, and then, the front press-fit platelet 31 of the upper shell 3 are inserted into two disposition press-fit slots 14 of the connector frame 1 to assemble the connector frame 1, the upper shell 3 and the circuit board 17 together, as shown in FIG. 5D. Next, the assembled back cover 2 and lower shell 4 is turned upside down; then, the press-fit hooks 41 of the lower shell 4 are aimed at the disposition press-fit slots 14 on two lateral sides of the connector frame 1, and the trench 26 of the back cover 2 is aimed at the bent platelet 30 of the upper shell 3, and they are joined together by insertion, as shown in FIG. 5E; then, slight press actions are applied all over the electrical card, and the electrical card is thus assembled well, as shown in FIG. 5F. Such an assembly design is rapid and convenient.

Figure 6A:
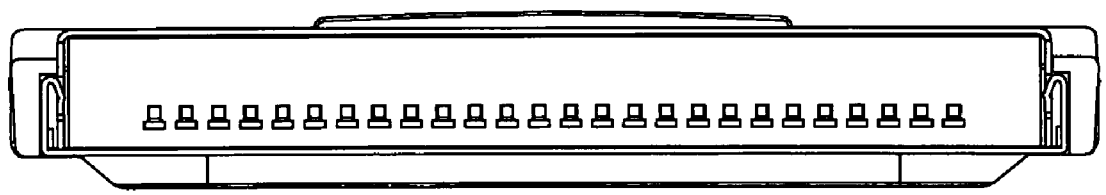
FIG. 6A a front view of the assembly structure of Type I short electrical card according to the present invention.
Figure 6B:
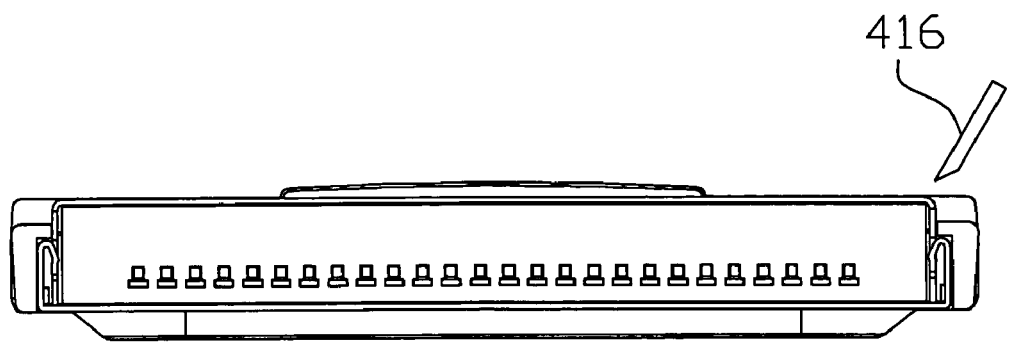
FIG. 6B to FIG. 6F are schematic diagrams showing the disassembly steps of the assembly structure of Type I short electrical card according to the present invention.
Figure 6C:
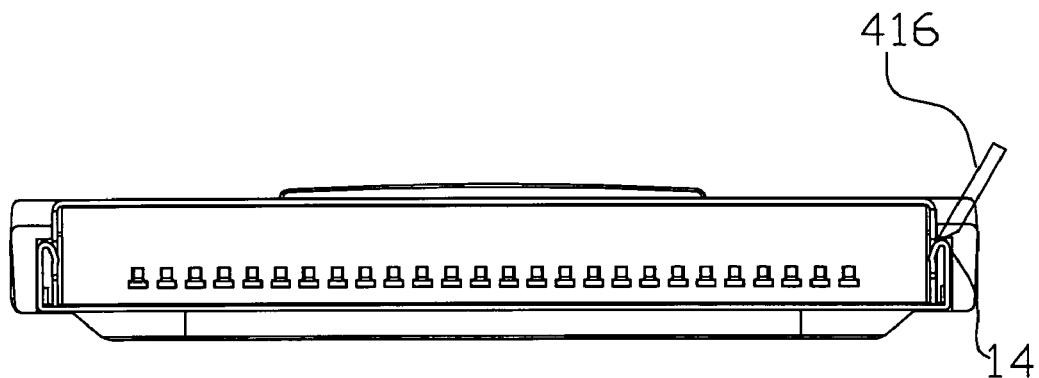
Figure 6D:
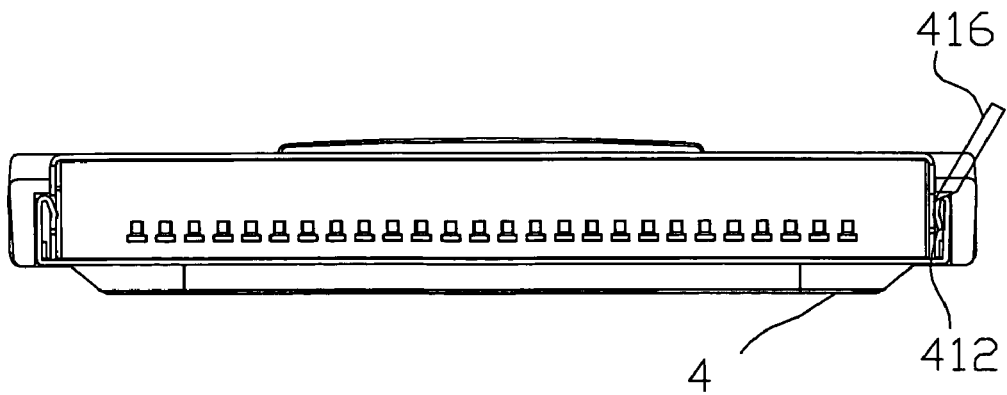
Figure 6E:
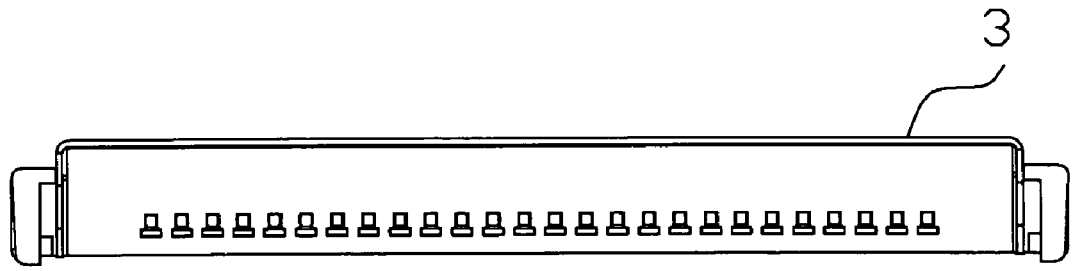
Figure 6F:
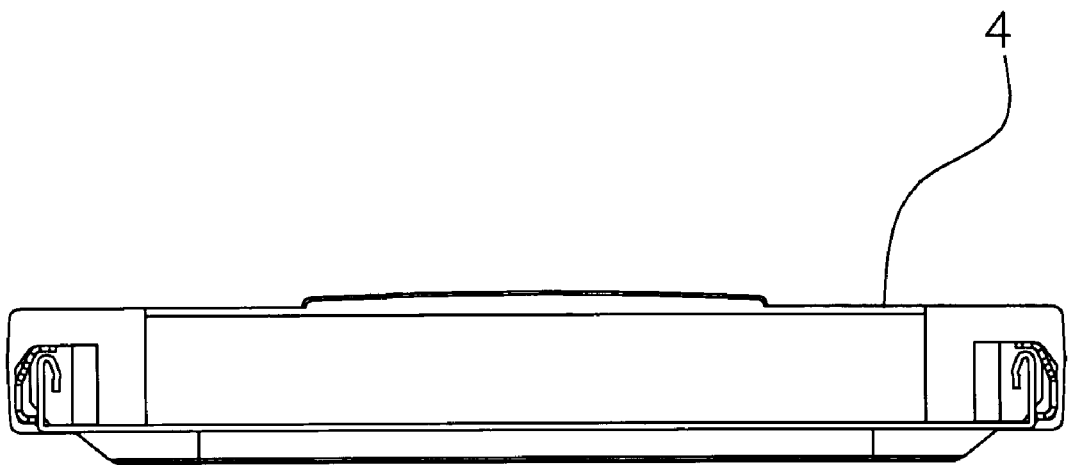

Refer to FIG. 6A a front view of the assembly structure of Type I short electrical card according to the present invention. The finished Type I short electrical card will be tested. If the test is NG (No Go), there may be problems in the circuit board or other electronic elements, and the assembly structure of the short electrical card needs disassembling for detecting the problems. Refer to from FIG. 6B to FIG. 6F schematic diagrams showing the disassembly steps of the assembly structure of Type I short electrical card according to the present invention. Also refer to FIG. 3D1, FIG. 3D2, FIG. 3E1, and FIG. 3E2. Firstly, a thin stick 416 is provided for disassembling the short electrical card, as shown in FIG. 6B. Next, the thin stick 416 is inserted into the disposition press-fit slot 14, as shown in FIG. 6C. Next, the thin stick 416 touches the bent platelet 412 of the press-fit hook 41 of the lower shell 4 to slightly decrease the radius of curvature of the bent region; when the radius of curvature of the bent region is decreased, the bent platelet 412 is released from the through-hole 34 of the front press-fit platelet 31, as shown in FIG. 6D. Thereby, the assembly structure of Type I short electrical card can be easily disassembled. The disassembled upper and lower shells 3, 4 are separately shown in FIG. 6E and FIG. 6F.

Figure 6G:
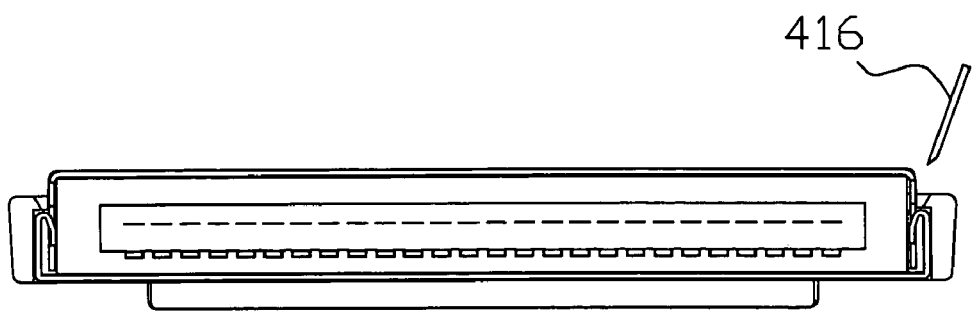
FIG. 6G to FIG. 6J are section views showing the disassembly steps of the assembly structure of Type I short electrical card according to the present invention.
Figure 6H:
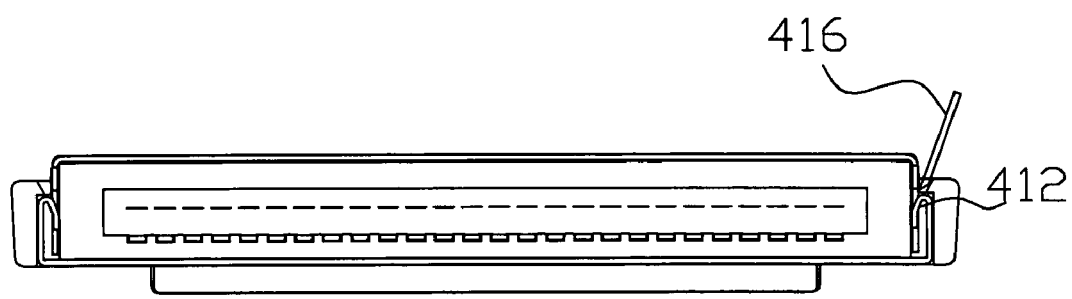
Figure 6I:
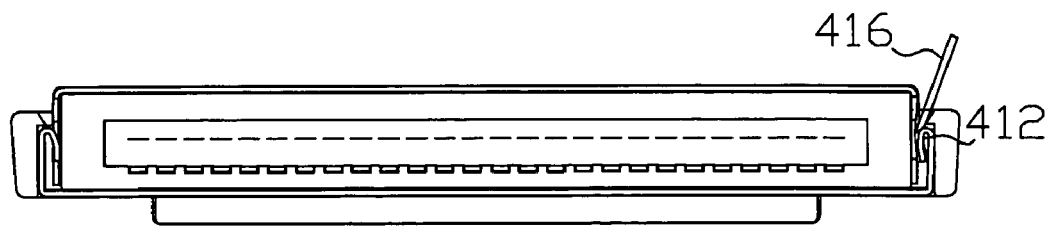
Figure 6J:
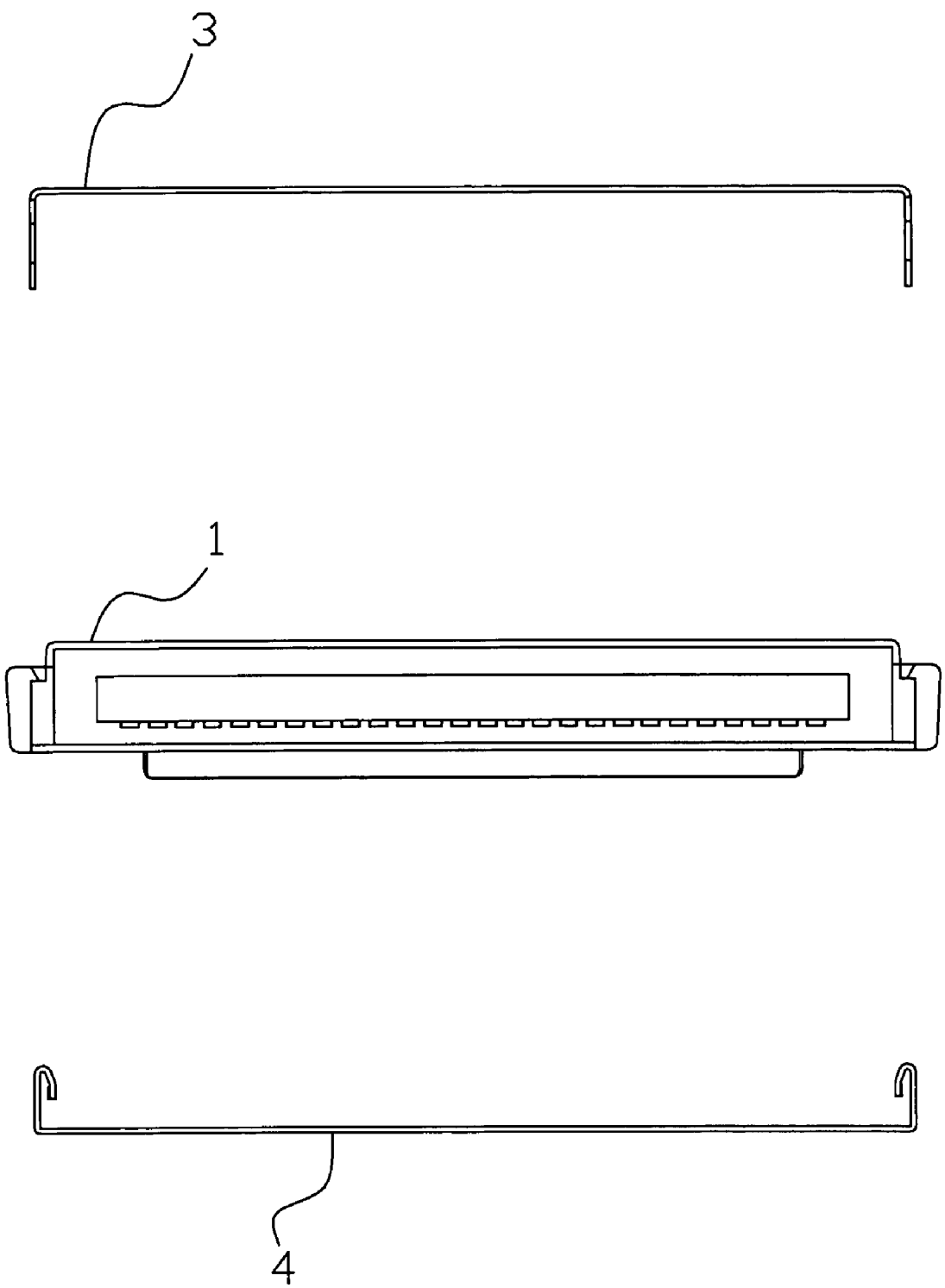

Refer to from FIG. 6G to FIG. 6J section views showing the disassembly steps of Type I short electrical card structure according to the present invention. The disassembly steps of the press-fit structure of Type I short electrical card are to be described below. As shown in FIG. 6G a diagram showing a preparation step, a thin stick 416 is placed above the press-fit structure of the short electrical card. As shown in FIG. 6H a diagram showing a pre-insertion step, the thin stick 416 is inserted into the disposition press-fit slot 14 and touches the bent platelet 412 of the lower shell 4. As shown in FIG. 6I a diagram showing an insertion step, the thin stick 416 is pushed to deform the bent platelet 412 and decrease the radius of curvature of the bent region so that the bent platelet 412 can be released from the through-hole 34 of the front press-fit platelets 31. As shown in FIG. 6J a diagram showing a separation step, once the bent platelet 412 of the lower shell 4 is released from the through-hole 34 of the front press-fit platelets 31, the structure of the short electrical card can be separated into the upper shell 3, the lower shell 4 and the connector frame 1.

Refer to FIG. 7A1 and FIG. 7A2 respectively a diagram showing the bottom face of the assembly structure of Type I short electrical card according to the present invention and a partially enlarged view thereof. Also refer to from FIG. 7B1 to FIG. 7D side views schematically showing the disassembly steps of the short electrical card structure. Firstly, as shown in FIG. 7B1 and FIG. 7B2, a thin stick 416 is placed above a hole 415 at position A of the lower shell 4, and then, the thin stick 416 is inserted into the hole 415 at position A. Next, as shown in FIG. 7C1 and FIG. 7C2, the thin stick 416 is placed above another hole 415 at position B of the lower shell 4, and then, the thin stick 416 is inserted into the hole 415 at position B. Thereby, the upper shell 3 and the lower shell 4 of the short electrical card structure are partially separated, as shown in FIG. 7D.

Turn the short electrical card structure upside down. Refer to FIG. 7E1 and FIG. 7E2 respectively a diagram showing the top face of the assembly structure of Type I short electrical card according to the present invention and a partially enlarged view thereof. Also refer to from FIG. 7F1 to FIG. 7H side views schematically showing the disassembly steps of the short electrical card structure. As shown in FIG. 7F1 and FIG. 7F2, the thin stick 416 is placed above the disposition press-fit slot 14 at position C of the upper shell 3, and then, the thin stick 416 is inserted into the disposition press-fit slot 14 at position C. Next, as shown in FIG. 7G1 and FIG. 7G2, the thin stick 416 is placed above another disposition press-fit slot 14 at position D of the upper shell 3, and then, the thin stick 416 is inserted into the disposition press-fit slot 14 at position D. Thereby, the upper shell 3 and the lower shell 4 of the short electrical card structure are completely separated, as shown in FIG. 7H.

Figure 7I:
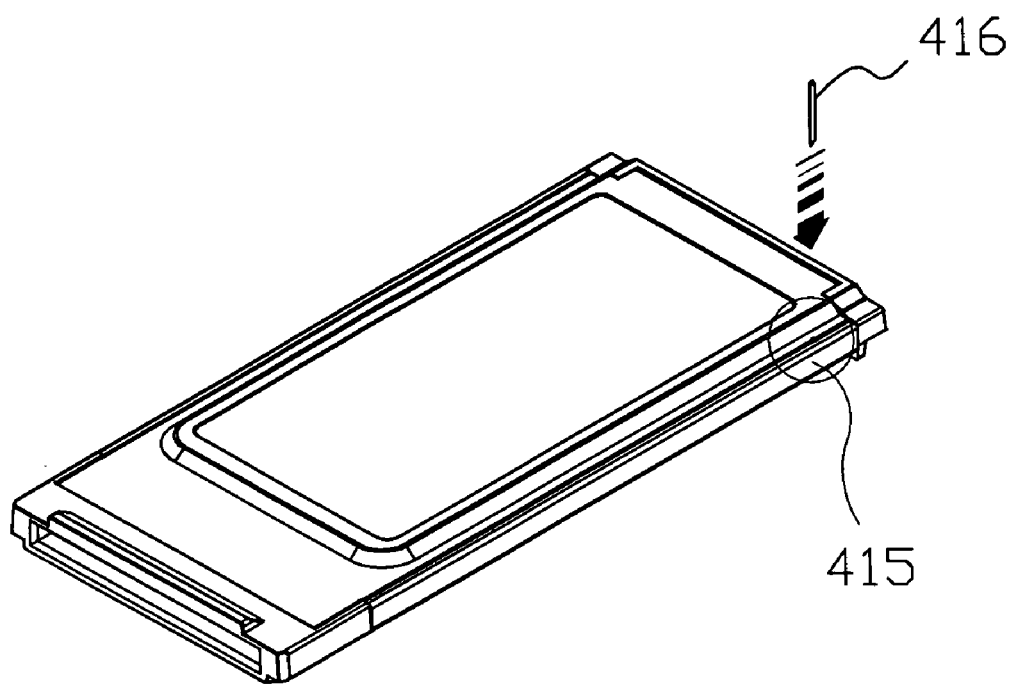
FIG. 7I a perspective view from the bottom face of the assembly structure of Type I short electrical card according to the present invention.
Figure 7J:
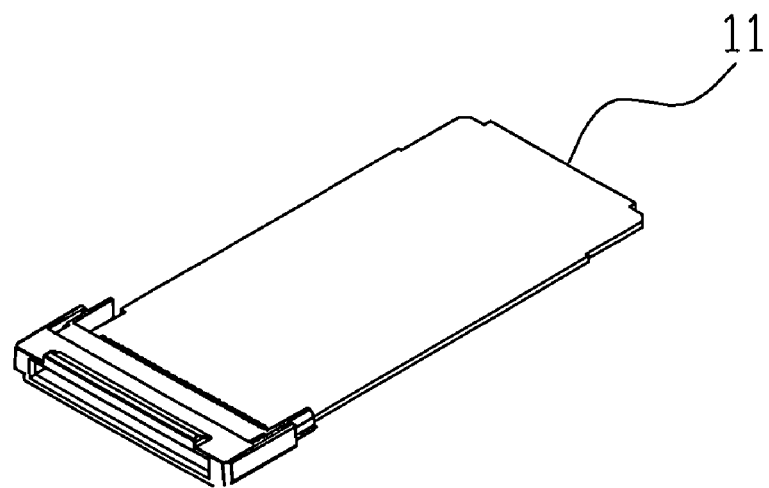
FIG. 7J is a structural diagram of the bottom face of the internal circuit board of the assembly structure of Type I short electrical card according to the present invention.
Figure 7K:
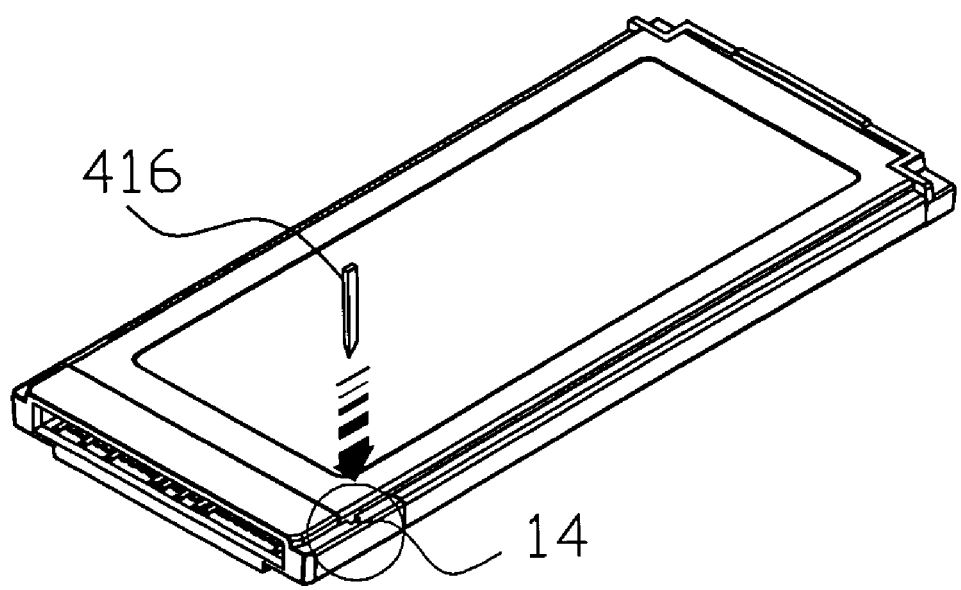
FIG. 7K a perspective view from the top face of the assembly structure of Type I short electrical card according to the present invention.
Figure 7L:
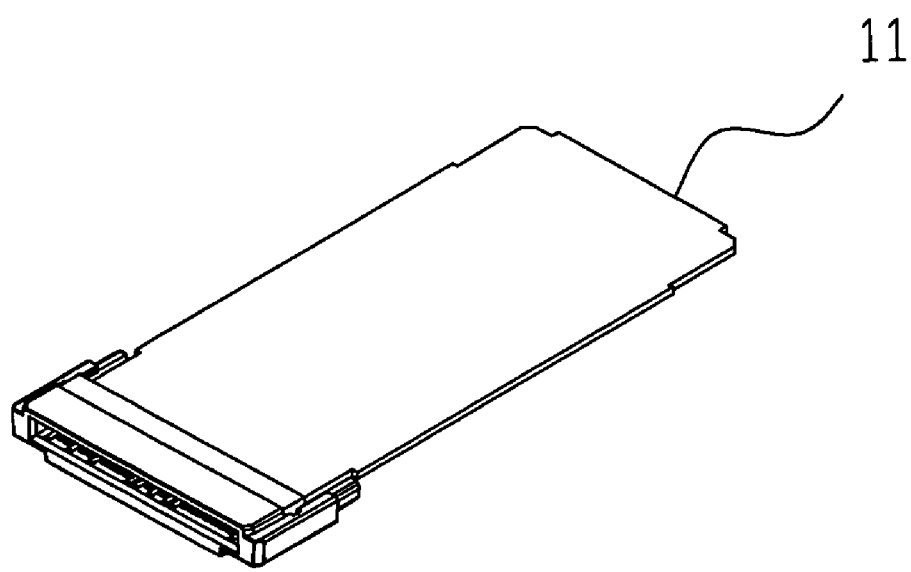
FIG. 7L is a structural diagram of the top face of the internal circuit board of the assembly structure of Type I short electrical card according to the present invention.

Refer to FIG. 7I a perspective view from the bottom face showing the disassembly of Type I short electrical card structure according to the present invention. The upper and lower shells will be separated via inserting the thin stick 416 into the hole 415 on the bottom face of the short electrical card structure. The bottom face of the structure of the circuit board 11 inside the short electrical card is shown in FIG. 7J. As shown in FIG. 7K, the upper and lower shells will be separated via inserting the thin stick 416 into the disposition press-fit slot 14 on the top face of the short electrical card structure. The top face of the structure of the circuit board 11 inside the short electrical card is shown in FIG. 7L.

Figure 8:
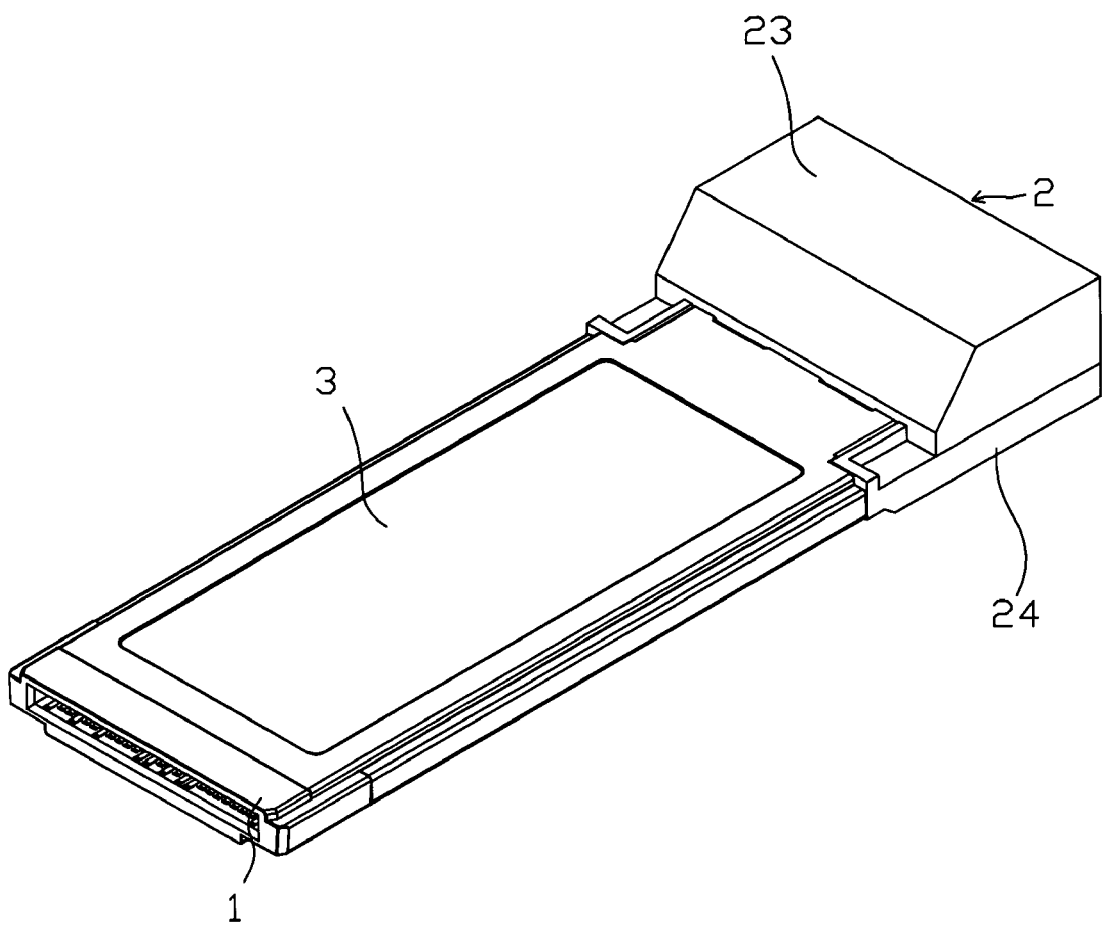
FIG. 8 is a perspective view schematically showing the assembly structure of Type I long electrical card according to the present invention.
Figure 9A:
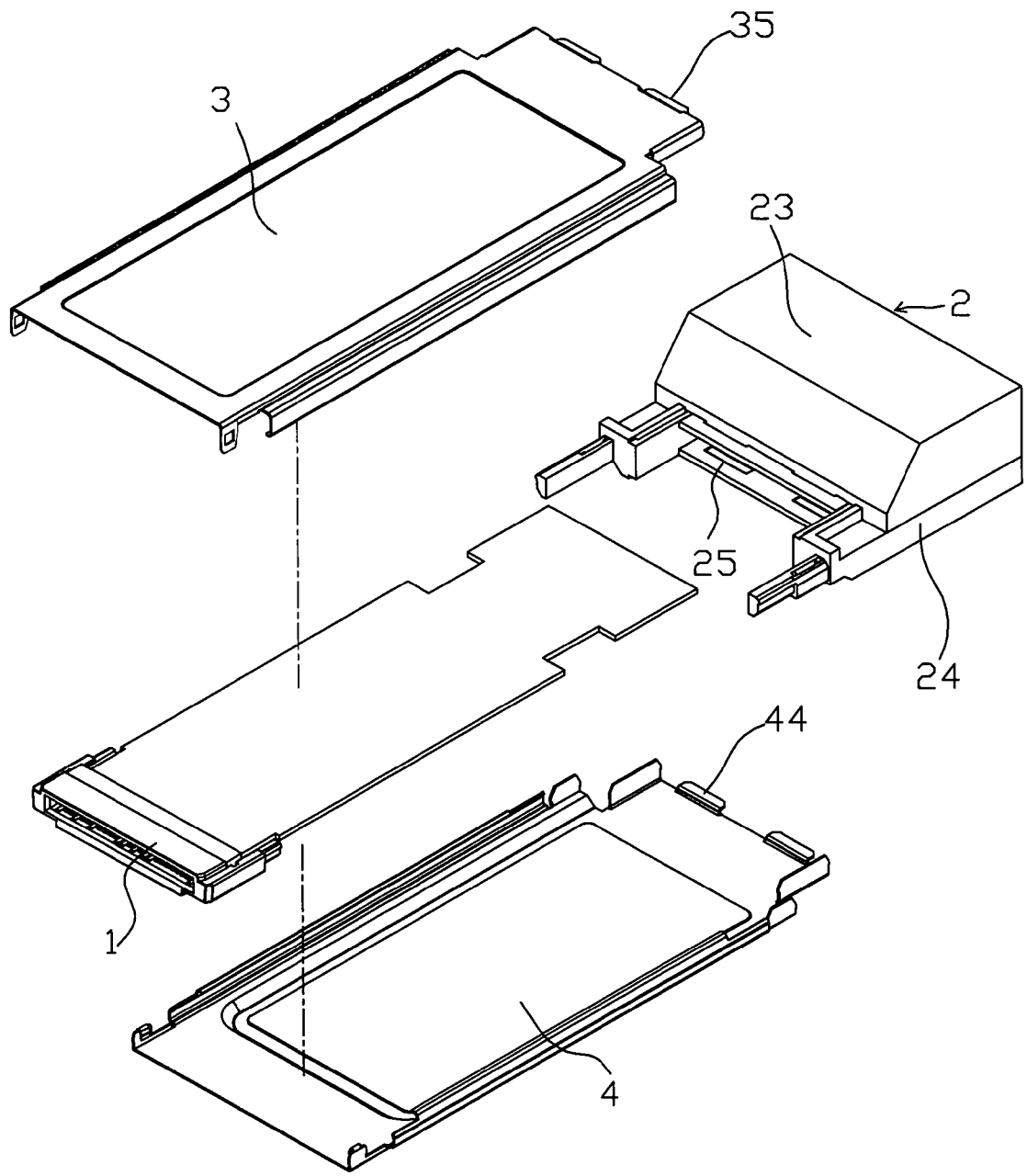
FIG. 9A is an exploded view of the assembly structure of Type I long electrical card according to the present invention.

Refer to FIG. 8 and FIG. 9A for the assembly structure of Type I long electrical card according to the present invention. Type I long electrical card structure also comprises: a connector frame 1, an upper shell 3, a lower shell 4 and a back cover 2. The upper shell 3 and the lower shell 4 respectively have insertion platelets 35, 44 on the ends to be installed to the back cover 2. A top cover 23 and a bottom cover 24 are press-fit to form the back cover 2. The edges of the top and bottom surfaces of the back cover 2 separately have multiple slits 25 at the positions corresponding to the insertion platelets 35, 44. In assembly, the insertion platelets 35, 44 of the upper and lower shells 3, 4 are inserted into the slits 25 of the back cover 2 to enhance the engagement between the back cover 2 and the upper and lower shells 3,4. The rest of the assembly structure of Type I long electrical card and the assembly and disassembly methods thereof are similar to those of the above-mentioned assembly structure of Type I short electrical card and no more repeated herein. Please refer to Taiwan patent No.91208240 for the detailed structures of the insertion platelets 35, 44 and the slit 25.

Figure 9B:
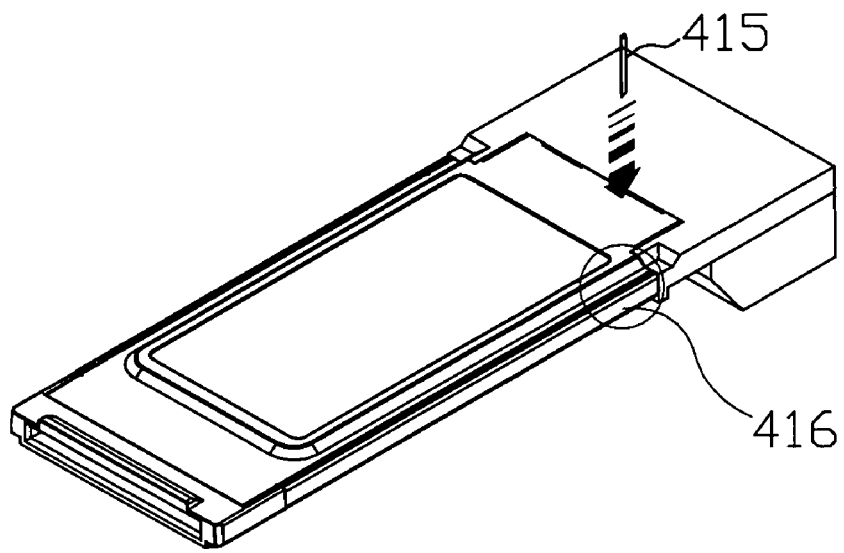
FIG. 9B a perspective view from the bottom face of the assembly structure of Type I long electrical card according to the present invention.
Figure 9C:
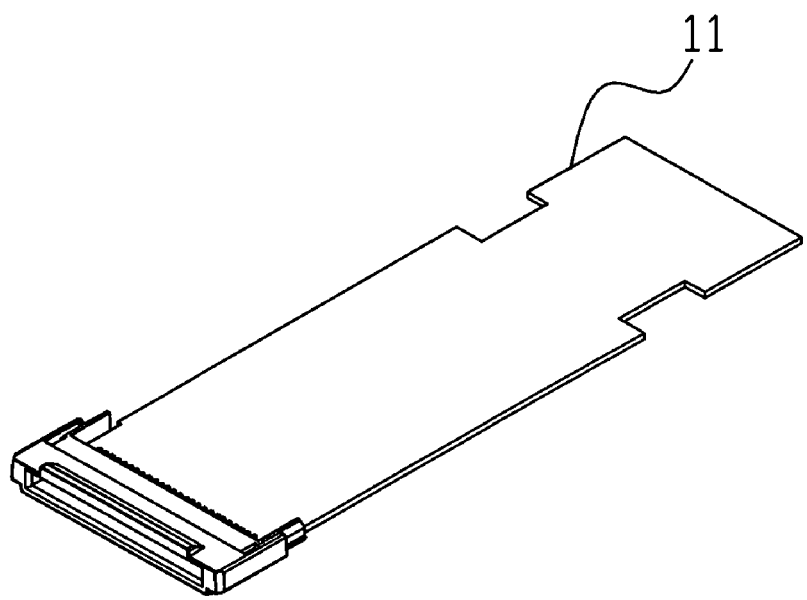
FIG. 9C is a structural diagram of the bottom face of the internal circuit board of the assembly structure of Type I long electrical card according to the present invention.
Figure 9D:
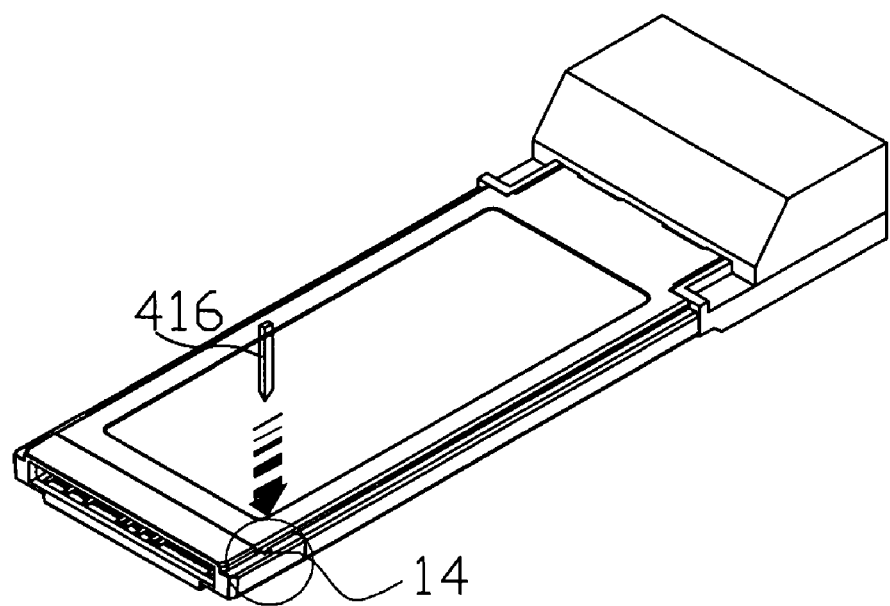
FIG. 9D a perspective view from the top face of the assembly structure of Type I long electrical card according to the present invention.
Figure 9E:
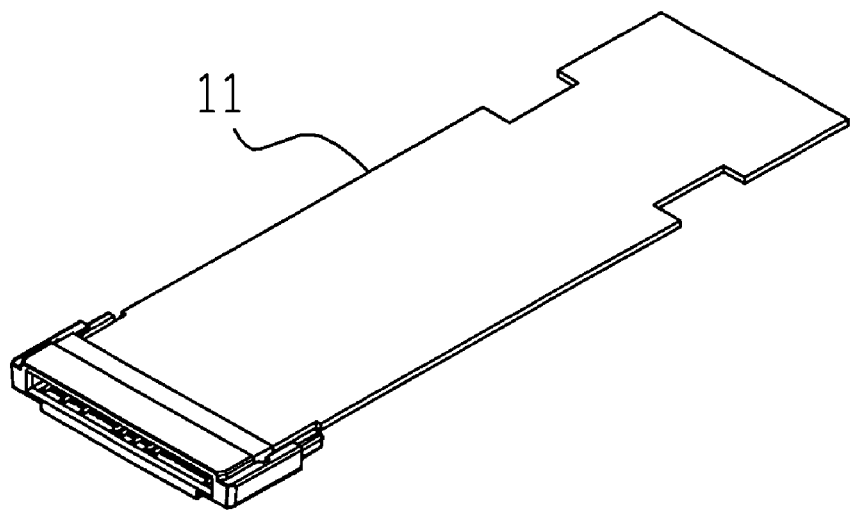
FIG. 9E is a structural diagram of the top face of the internal circuit board of the assembly structure of Type I long electrical card according to the present invention.

Refer to FIG. 9B a perspective view from the bottom face showing the disassembly of Type I long electrical card structure according to the present invention. The upper and lower shells will be separated via inserting the thin stick 416 into a hole 415 on the bottom face of the long electrical card structure. The bottom face of the structure of the circuit board 11 inside Type I long electrical card is shown in FIG. 9C. As shown in FIG. 9D, the upper and lower shells will be separated via inserting the thin stick 416 into the disposition press-fit slot 14 on the top face of Type I long electrical card. The top face of the structure of the circuit board 11 inside Type I long electrical card is shown in FIG. 9E.

Figure 9F:
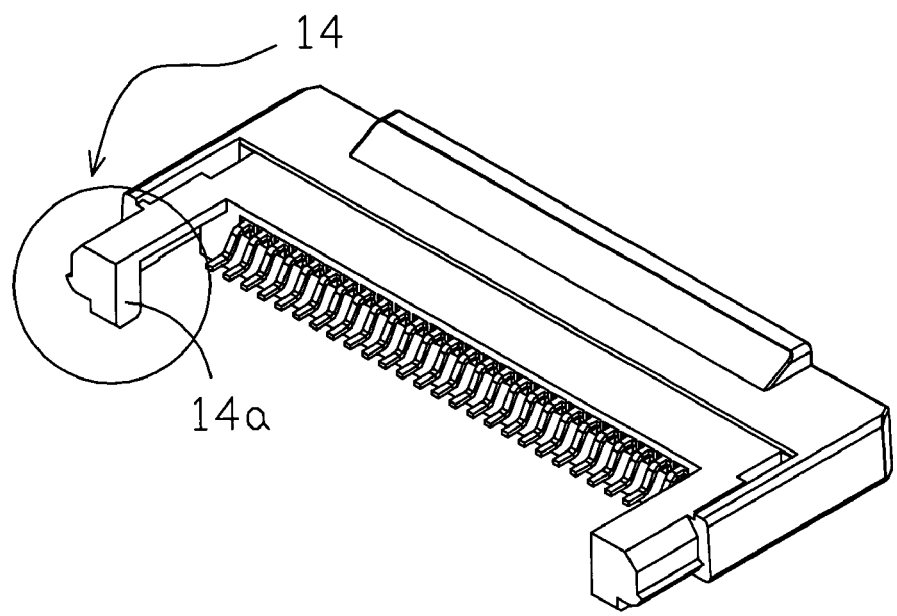
FIG. 9F is a schematically front-view diagram illustrating a disposition press-fit slot according to another embodiment of the present invention.
Figure 9G:
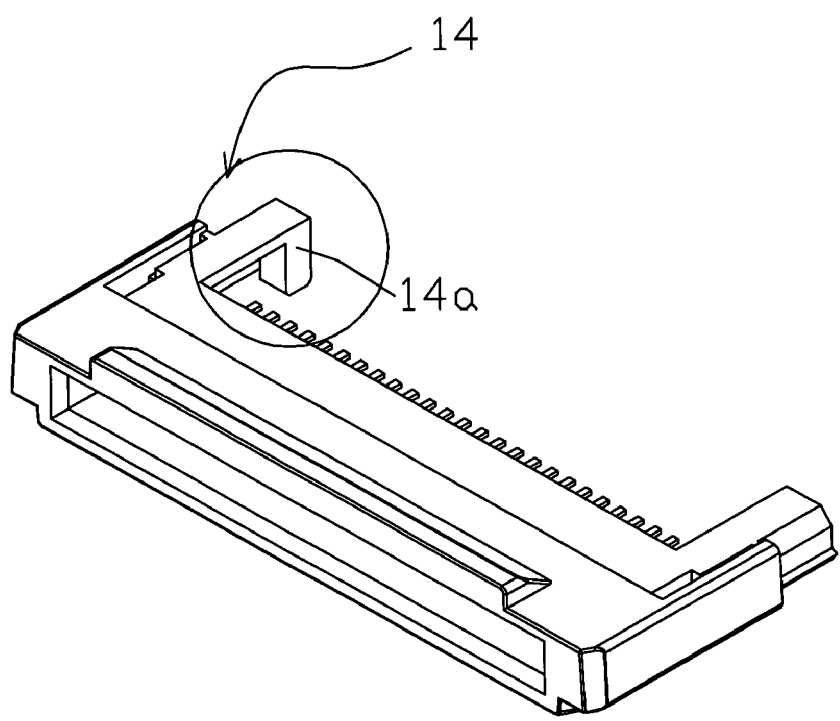
FIG. 9G is a schematically backside-view diagram illustrating a disposition press-fit slot according to another embodiment of the present invention.
Figure 9H:
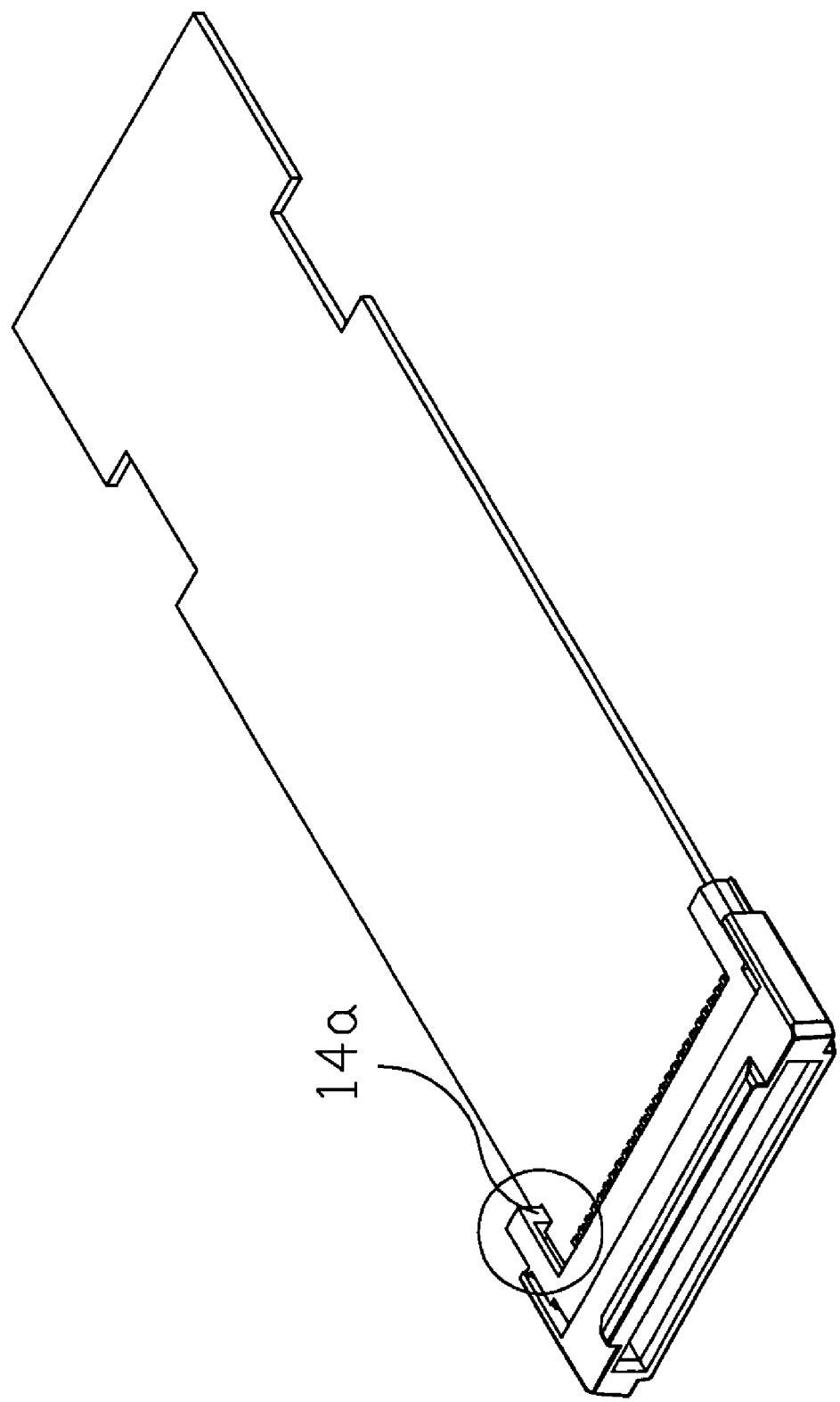
FIG. 9H is a schematically backside-view diagram illustrating a disposition press-fit slot and a short electrical card according to another embodiment of the present invention.

Furthermore, FIG. 9F is a schematically front-view diagram illustrating a disposition press-fit slot 14 according to another embodiment of the present invention. Depicted in FIG. 9F, the disposition press-fit slot 14 has at least one end with the right-angle downward bump 14a adopted for constraining the electrical card. The backside-view disposition press-fit slot 14 is shown in FIG. 9G. Next, FIG. 9H is a schematically backside-view diagram illustrating assembly of the disposition press-fit slot and a short electrical card. The bump 14a of the disposition press-fit slot 14 may engage the electrical card to provide the electrical card with enhanced fixing and loading.

After the description of the assembly structures of Type I short and long electrical cards, the assembly structure of Type II short and long electrical cards will be described below.

Figure 10:
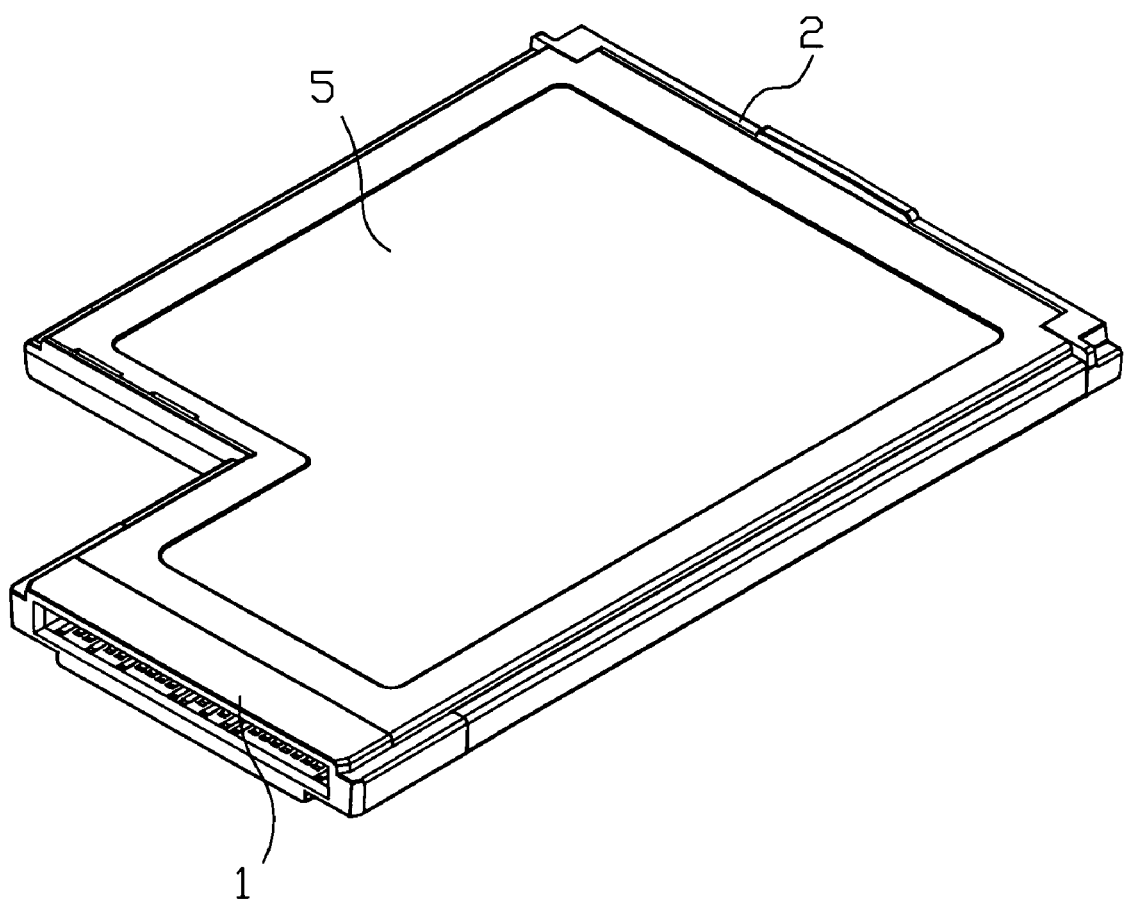
FIG. 10 is a perspective view schematically showing the assembly structure of Type II short electrical card according to the present invention.
Figure 11:
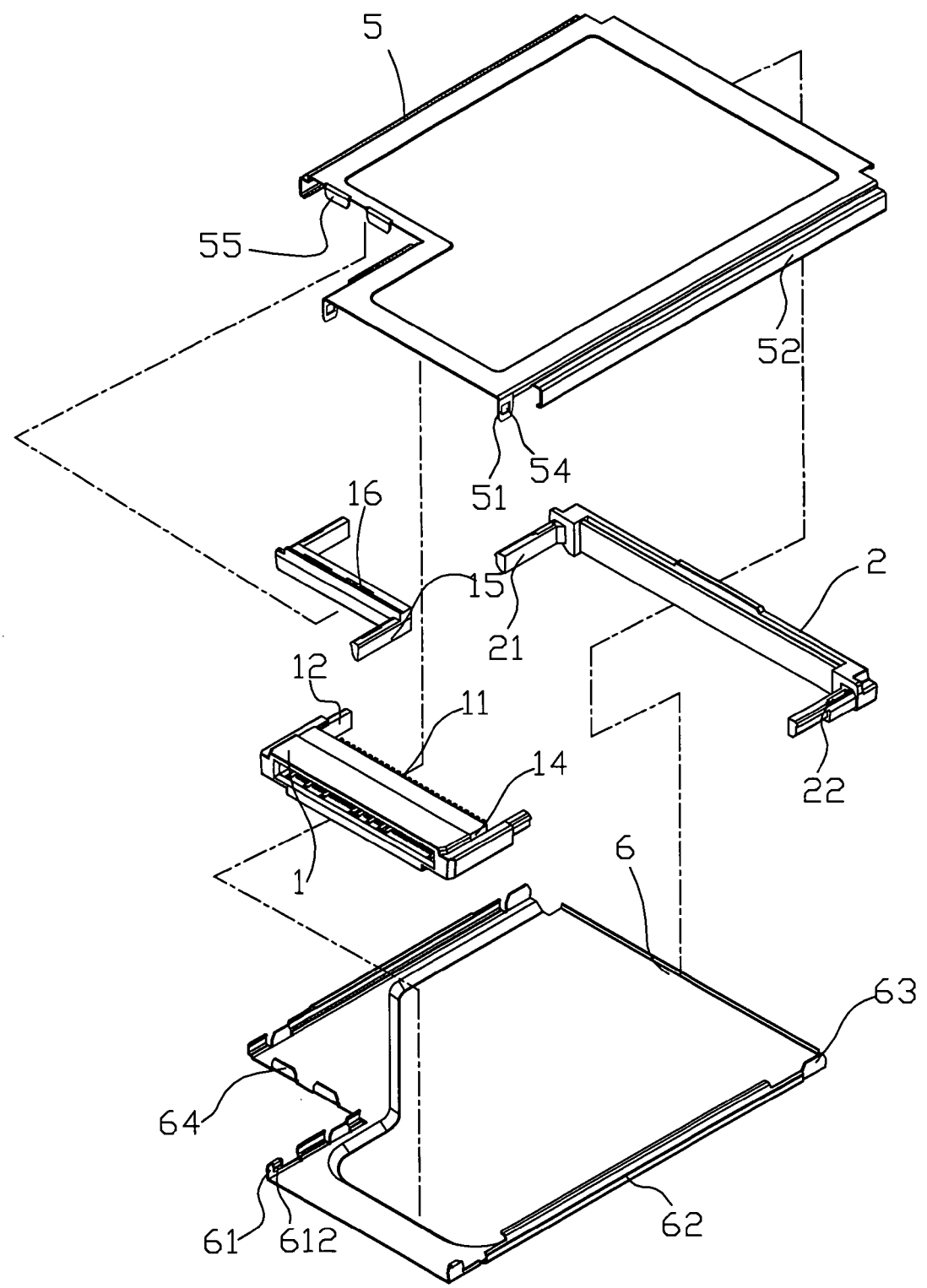
FIG. 11 is an exploded view of the assembly structure of Type II short electrical card according to the present invention.

Refer to FIG. 10 and FIG. 11 a perspective view schematically showing the assembly structure of Type II short electrical card according to the present invention and the exploded view thereof. The assembly structure of Type II short electrical card according to the present invention comprises: a connector frame 1, a back cover 2, an L-shape upper shell 5, and an L-shape lower shell 6. Two clamp arms 12 separately symmetrically protrude from two lateral sides of the connector frame 1. An N-shape connection arm 15 extends from one of the clamp arm 12. Multiple press-fit slots 16 are separately formed on the top and bottom surfaces of the N-shape connection arm 15, and each lateral side of the connector frame 1 has a disposition press-fit slot 14. The back cover 2 is disposed corresponding to the connection frame 1. Two extension arms 21 separately extend from two lateral sides of the back cover 2. Each lateral side of the back cover 2 has two press-fit slots 22 separately on the top and bottom surfaces thereof. The L-shape upper and lower shells 5, 6 can be press-fit to form a unitary body. Two front press-fit platelets 51 and two first bent portions 52 are symmetrically formed on two lateral sides of the L-shape upper shell 5. Corresponding to those two front press-fit platelets 51 and two first bent portions 52, two press-fit hooks 61 and two second bent portions 62 are formed on two lateral sides of the L-shape lower shell 6. The L-shape lower shell 6 also has rear press-fit platelets 63. The L-shape upper and lower shells 5, 6 separately have multiple press-fit platelets 55, 64 at the positions corresponding to the press-fit slots 16 of the N-shape connection arm 15, and the press-fit platelets 55, 64 can be inserted into the press-fit slots 16 of the N-shape connection arm 15 and fixed thereto. The front press-fit platelet 51 of the L-shape upper shell 5 has a through-hole 54. The press-fit hook 61 of the L-shape lower shell 6 has an inward bent platelet 612. Inside the disposition press-fit slot 14 of the connector frame 1, the bent platelet 612 is press-fit into the through-hole 54 of the front press-fit platelet 51 of the L-shape upper shell 5. The rear press-fit platelets 63 and the press-fit platelets 64 of the L-shape lower shell 6 can be separately inserted into the press-fit slots 22 of the back cover 2 and the press-fit slots 16 of N-shape connection arm 15. Thereby, one end of the L-shape upper shells 5 and one end of the L-shape lower shell 6 are engaged to the connector frame 1 and two clamp arms 12 thereof, and the other ends of the L-shape upper and lower shells 5, 6 are engaged to the back cover 2 and two extension arms 21 thereof, and the first bent portions 52 of the L-shape upper shell 5 wrap the second bent portions 62 of the L-shape lower shell 6 and are press-fit with the second bent portions 62 of the L-shape lower shell 6. Thus, Type II short electrical card structure is assembled well.

The seams of the assembled L-shape upper and lower shells 5, 6 will appear on the bottom surface of Type II short electrical card structure, which can improve the appearance of the electrical card.

In assembly, firstly, the press-fit hooks 61, the rear press-fit platelets 63 and the press-fit platelets 64 of the L-shape lower shell 6 are separately inserted into the disposition press-fit slots 14 of the connector frame 1, the press-fit slots 22 of the back cover 2, and the press-fit slots 16 of the N-shape connection arm 15. The press-fit hooks 61 will tightly press against the inner surfaces of the disposition press-fit slots 14, which temporarily holds the L-shape lower shell 6, and the L-shape lower shell 6 will also tightly press against the clamp arms 12 and the extension arms 21 for supporting the L-shape lower shell 6 itself, thus, the L-shape lower shell 6, the connector frame 1 and the back cover 2 can be held together. Next, the front press-fit platelets 51 and the press-fit platelets 55 of the L-shape upper shell 5 are separately inserted into the disposition press-fit slots 14 of the connector frame 1 and the press-fit slots 16 of the N-shape connection arm 15. Then, the front press-fit platelets 51 are securely press-fit together with the press-fit hooks 61, and the L-shape upper shell 5 also tightly presses against the clamp arms 12 and the extension arms 21, and the first bent portions 52 of the L-shape upper shell 5 wrap the second bent portions 62 of the L-shape lower shell 6 and are press-fit with the second bent portions 62 of the L-shape lower shell 6. Thereby, the L-shape upper and lower shells 5, 6, the connector frame 1 and the back cover 2 are assembled into a Type II short electrical card structure. The disassembly method thereof is similar to that of Type I short electrical card structure, and it is no more repeated herein.

Figure 12:
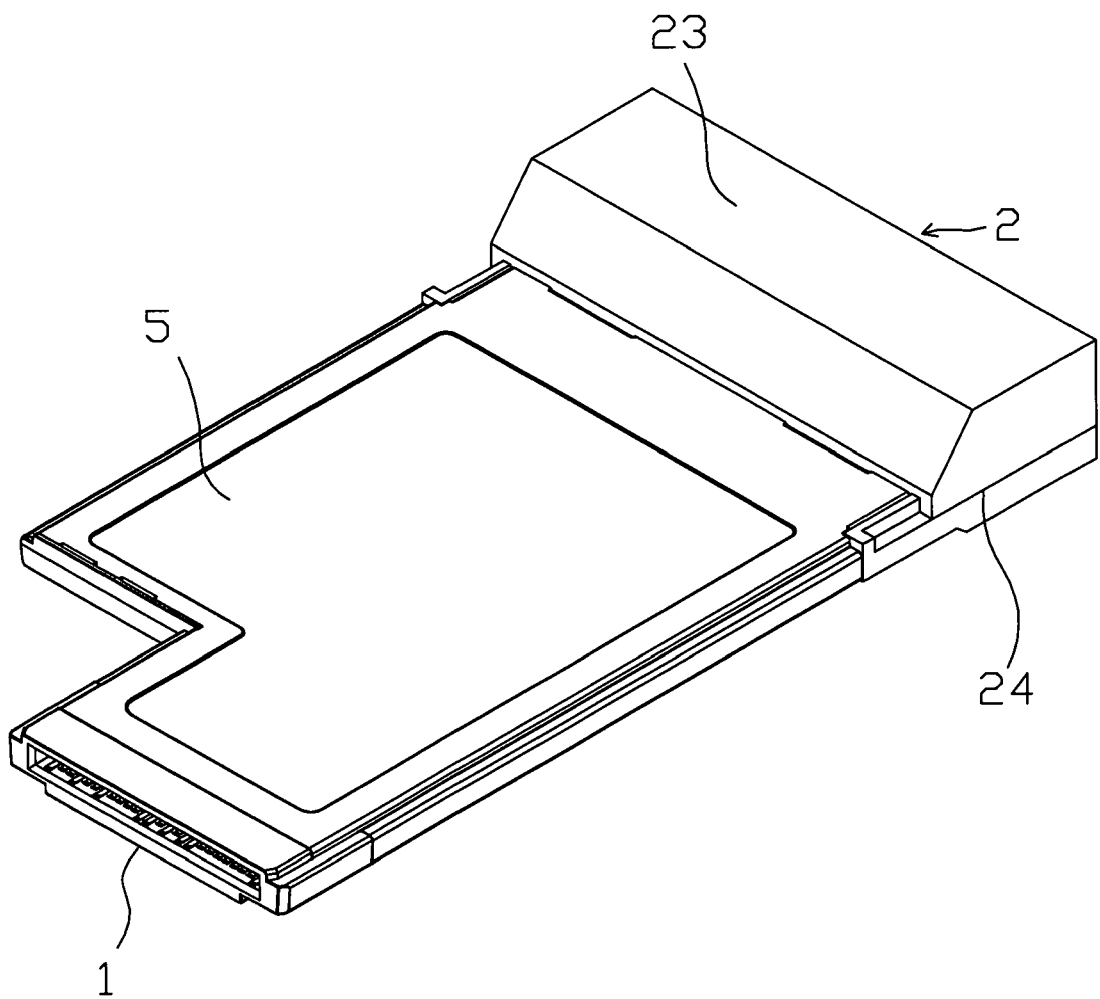
FIG. 12 is a perspective view schematically showing the assembly structure of Type II long electrical card according to the present invention.
Figure 13:
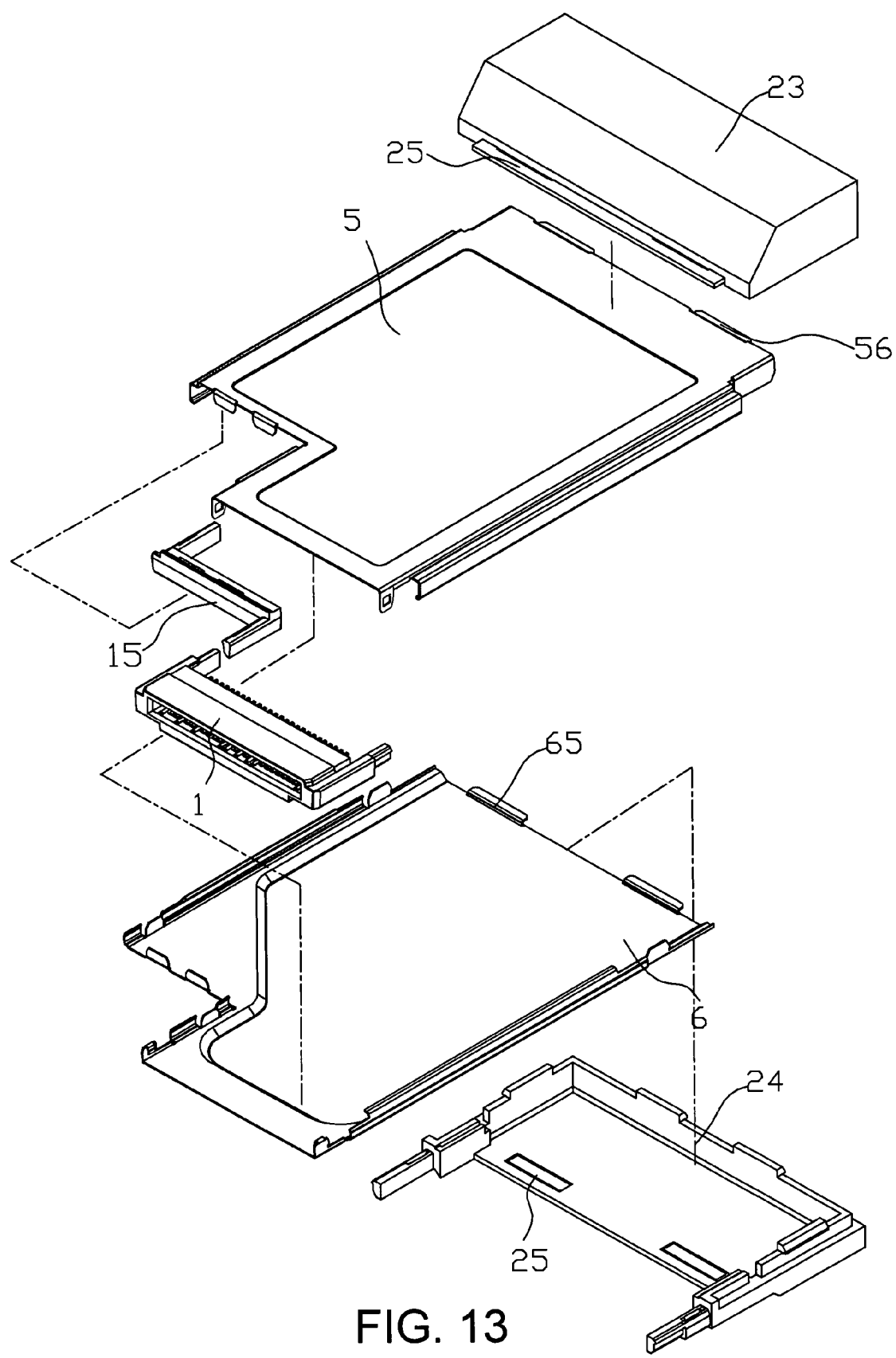
FIG. 13 is an exploded view of the assembly structure of Type II long electrical card according to the present invention.

Refer to FIG. 12 and FIG. 13 for the assembly structure of Type II long electrical card according to the present invention. The assembly structure of Type II long electrical card according to the present invention also comprises: a connector frame 1, a back cover 2, an L-shape upper shell 5, and an L-shape lower shell 6. The L-shape upper and lower shells 5, 6 respectively have insertion platelets 56, 65 on the ends to be installed to the back cover 2. A top cover 23 and a bottom cover 24 are press-fit to form the back cover 2. The edges of the top and bottom surfaces of the back cover 2 separately have multiple slits 25 at the positions corresponding to the insertion platelets 56, 65. In assembly, the insertion platelets 56, 65 of the upper and lower shells 5, 6 are inserted into the slits 25 of the back cover 2 to enhance the engagement between the back cover 2 and the upper and lower shells 5, 6. The rest of the assembly structure of Type II long electrical card and the assembly and disassembly methods thereof are similar to those of the abovementioned assembly structure of Type II short electrical card and no more repeated herein.

The present invention utilizes the connector frame to replace both the connector and the plastic frame in the conventional technology and utilizes a rigid joint mechanism to assemble an electrical card having superior engagement. The assembly structures of the upper and lower shells are simple and secure, and can be assembled by the user himself, and can be easily disassembled for fixing the circuit thereinside.

Those described above are only the preferred embodiments of the present invention to enable the persons skilled in the art to understood, make and use the present invention but not intended to limit the scope of the present invention. Any equivalent modification and variation according to the sprit of the present invention disclosed herein is to be included within the scope of the claims of the present invention.

What is claimed is:

1. An assembly structure of an electrical card, comprising: a connector frame, having multiple contact terminals at its rear side with the tail ends of said contact terminals electrically connected with electric contacts at the front end of a circuit board, wherein two clamp arms separately protrude from two lateral sides of said connector frame; a back cover, having two extension arms separately extending from two lateral sides thereof; and a shell, further comprising an upper shell and a lower shell, which can be press-fit together to form a unitary body that encapsulates said circuit board, wherein at least one front press-fit platelet is formed on each lateral side in the end of said upper shell to be installed to said connector frame, and said lower shell has at least one press-fit hook at the positions corresponding to said front press-fit platelets; said press-fit hooks of said lower shell are inserted between said connector frame and said clamp arms, and press-fit with said front press-fit platelets of said upper shell to install both said upper shell and said lower shell to said two clamp arms; the other ends of said upper shell and said lower shell are press-fit to said back cover and wrap said two extension arms to assemble said upper shell, said lower shell, said connector frame and said back cover into an electrical card structure;

wherein said front press-fit platelet of said upper shell has a through-hole, and said press-fit hook of said lower shell has an inward bent platelet, and said bent platelet is to be press-fit into said through-hole of said front press-fit platelet to engage said front press-fit platelet of said upper shell with said press-fit hook of said lower shell.

2. The assembly structure of an electrical card according to claim 1, wherein each lateral side of said upper shell has a first bent portion, and each lateral side of said lower shell has a second bent portion at the position corresponding to said first bent portion; said first bent portions of said upper shell wrap said second bent portions of said lower shell, and thereby, said upper shell and said lower shell are press-fit together.

3. The assembly structure of an electrical card according to claim 1, wherein a hole is formed on the bottom surface of said electrical card assembly structure for disassembly.

4. The assembly structure of an electrical card according to claim 1, wherein rear press-fit platelets are separately formed on two lateral sides in the rear ends of said upper shell and said lower shell near said back cover, and the top and bottom surface of said back cover have press-fit slots at the positions corresponding to said rear press-fit platelets, and said rear press-fit platelets of said upper shell and said lower shell can be inserted into said press-fit slots of said back cover.

5. The assembly structure of an electrical card according to claim 1, wherein said back cover is formed via press-fitting an upper cover and a lower cover into a unitary body.

6. The assembly structure of an electrical card according to claim 1, wherein disposition press-fit slots are formed between said connector frame and said clamp arms, and said press-fit hooks of said lower shell can be disposed inside said disposition press-fit slots and tightly press against the inner surfaces of said disposition press-fit slots.

7. The assembly structure of an electrical card according to claim 1, wherein said electrical card structure is a short one.

8. The assembly structure of an electrical card according to claim 7, wherein rear press-fit platelets are separately formed on two lateral sides of said upper shell and said lower shell near said back cover, and the top and bottom surface of said back cover have press-fit slots at the positions corresponding to said rear press-fit platelets, and said rear press-fit platelets of said upper shell and said lower shell can be inserted into said press-fit slots of said back cover.

9. The assembly structure of an electrical card according to claim 8, wherein the rear side of said upper shell has a bent platelet, and said back cover has a trench, and said bent platelet of said upper shell can be inserted into said trench of said back cover.

10. An assembly structure of an electrical card, comprising: a connector frame, having multiple contact terminals at its rear side with the tail ends of said contact terminals electrically connected with electric contacts at the front end of a circuit board, wherein two clamp arms separately protrude from two lateral sides of said connector frame, and an N-shape connection arm extends from one of said clamp arms; a back cover, having two extension arms separately extending from two lateral sides thereof; and a shell, further comprising an L-shape upper shell and an L-shape lower shell, which can be press-fit together to form a unitary body that encapsulates said circuit board, wherein at least one front press-fit platelet is formed on each lateral side in the end of said L-shape upper shell to be installed to said connector frame, and said L-shape lower shell has at least one press-fit hook at the positions corresponding to said front press-fit platelets; said press-fit hooks of said L-shape lower shell are inserted between said connector frame and said clamp arms, and press-fit with said front press-fit platelets of said L-shape upper shell to install both said L-shape upper shell and said L-shape lower shell to said two clamp arms and said N-shape connection arm; the other ends of said L-shape upper shell and said L-shape lower shell are press-fit to said back cover and wrap said two extension arms to assemble said shell, said connector and said back cover into an electrical card structure.

11. The assembly structure of an electrical card according to claim 10, wherein each lateral side of said L-shape upper shell has a first bent portion, and each lateral side of said L-shape lower shell has a second bent portion at the position corresponding to said first bent portion; said first bent portions of said L-shape upper shell wrap said second bent portions of said L-shape lower shell, and thereby, said L-shape upper shell and said L-shape lower shell are press-fit together.

12. The assembly structure of an electrical card according to claim 10, wherein said electrical card structure is a short one.

13. The assembly structure of an electrical card according to claim 10, wherein a hole is formed on the bottom surface of said electrical card assembly structure for disassembly.

14. The assembly structure of an electrical card according to claim 10, wherein disposition press-fit slots are formed between said connector frame and said clamp arms, and said press-fit hooks of said L-shape lower shell can be disposed inside said disposition press-fit slots and tightly press against the inner surfaces of said disposition press-fit slots.

15. The assembly structure of an electrical card according to claim 10, wherein at least one press-fit slot is separately formed on the top and the bottom surfaces of said N-shape connection arm, and at least one press-fit platelet is separately formed on said L-shape upper shell and said L-shape lower shell and at the positions corresponding to said press-fit slots of said N-shape connection arm, and said press-fit platelets of said L-shape upper shell and said L-shape lower shell can be inserted into said press-fit slots of said N-shape connection arm.

16. The assembly structure of an electrical card according to claim 10, wherein said front press-fit platelet of said L-shape upper shell has a through-hole, and said press-fit hook of said L-shape lower shell has an inward bent platelet, and said bent platelet of said press-fit hook of said L-shape lower shell is to be press-fit into said through-hole of said front press-fit platelet of said L-shape upper shell to engage said front press-fit platelet of said L-shape upper shell with said press-fit hook of said L-shape lower shell.

17. The assembly structure of an electrical card according to claim 10, wherein rear press-fit platelets are separately formed on two lateral sides of said L-shape upper shell and said L-shape lower shell near said back cover, and the top and bottom surface of said back cover have press-fit slots at the positions corresponding to said rear press-fit platelets, and said rear press-fit platelets of said L-shape upper shell and said L-shape lower shell can be inserted into said press-fit slots of said back cover.

18. The assembly structure of an electrical card according to claim 17, wherein the rear side of said L-shape upper shell has a bent platelet, and said back cover has a trench, and said bent platelet of said L-shape upper shell can be inserted into said trench of said back cover.

19. The assembly structure of an electrical card according to claim 10, wherein said electrical card structure is a long one.

20. The assembly structure of an electrical card according to claim 19, wherein rear press-fit platelets are separately formed on two lateral sides in the rear ends of said L-shape upper shell and said L-shape lower shell near said back cover, and the top and bottom surface of said back cover have press-fit slots at the positions corresponding to said rear press-fit platelets, and said rear press-fit platelets of said L-shape upper shell and said L-shape lower shell can be inserted into said press-fit slots of said back cover.

21. The assembly structure of an electrical card according to claim 19, wherein said back cover is formed via press-fitting an upper cover and a lower cover into a unitary body.

* * * * *